(12) United States Patent
Hsu

(10) Patent No.: US 10,437,146 B2
(45) Date of Patent: Oct. 8, 2019

(54) METHOD FOR FORMING A 3D PATTERN STRUCTURE ON A 3D SUBSTRATE AND DEVICE HAVING COLOR RESISTS PATTERN

(71) Applicant: Ming-An Hsu, Toufen Township, Miaoli County (TW)

(72) Inventor: Ming-An Hsu, Toufen Township, Miaoli County (TW)

( * ) Notice: Subject to any disclaimer, the term of this patent is extended or adjusted under 35 U.S.C. 154(b) by 212 days.

(21) Appl. No.: 15/395,804

(22) Filed: Dec. 30, 2016

(65) Prior Publication Data
US 2017/0192356 A1 Jul. 6, 2017

(30) Foreign Application Priority Data

Dec. 30, 2015 (TW) .............................. 104144531 A
Dec. 30, 2015 (TW) .............................. 104221179 U

(51) Int. Cl.
| | | |
|---|---|---|
| *G03F 7/20* | (2006.01) | |
| *G03F 7/00* | (2006.01) | |
| *G03F 7/105* | (2006.01) | |
| *G03F 7/18* | (2006.01) | |
| *G03F 7/24* | (2006.01) | |
| *G03F 7/38* | (2006.01) | |
| *G03F 1/60* | (2012.01) | |

(52) U.S. Cl.
CPC .......... *G03F 7/0035* (2013.01); *G03F 7/0007* (2013.01); *G03F 7/0037* (2013.01); *G03F 7/105* (2013.01); *G03F 7/18* (2013.01); *G03F 7/2014* (2013.01); *G03F 7/24* (2013.01); *G03F 7/38* (2013.01); *G03F 1/60* (2013.01)

(58) Field of Classification Search
CPC ........ G03F 1/60; G03F 7/0007; G03F 7/0037; G03F 7/0035; G03F 7/105; G03F 7/18; G03F 7/2014; G03F 7/2002; G03F 7/24; G02B 5/223; G02F 1/133514; G02F 1/133516
USPC ................................................. 430/7, 396, 5
See application file for complete search history.

(56) References Cited

U.S. PATENT DOCUMENTS

| | | | | |
|---|---|---|---|---|
| 2008/0038677 A1* | 2/2008 | Hogue | ...................... | G03F 1/14 430/325 |
| 2008/0079926 A1* | 4/2008 | Ito | ......................... | B82Y 10/00 355/73 |
| 2010/0289183 A1* | 11/2010 | Tsushima | ............... | G11B 5/855 264/293 |

* cited by examiner

*Primary Examiner* — John A McPherson
(74) *Attorney, Agent, or Firm* — Muncy, Geissler, Olds & Lowe, P.C.

(57) ABSTRACT

A method for forming a 3D pattern structure on a 3D substrate and a device having color resist pattern is disclosed. The disclosure uses the fitting aids to apply pressure on the thin-film mask to paste on the 3D substrate. After the template device had formed, send the template device to the exposure machine, and then the high resolution photo-resist pattern is made on the 3D substrate. After a Lift-off procedure, the thin-film pattern is formed and the photo-resist is removed.

12 Claims, 28 Drawing Sheets

US 10,437,146 B2

METHOD FOR FORMING A 3D PATTERN STRUCTURE ON A 3D SUBSTRATE AND DEVICE HAVING COLOR RESISTS PATTERN

TECHNICAL FIELD

The present disclosure relates to a 3D substrate, especially to a method for forming a 3D pattern structure on a 3D substrate and device having color resists pattern.

BACKGROUND

Nowadays, the smart device, such as smart phone, smart watch or smart medical device, with large-screen monitor is common and makes user receiving messages easier than before. Moreover, not only the size and the function are important for the large-screen monitors, the visual appearance including the shape, the contour and the color is also a part which is paid attention to. A stellar exterior design and the manufacturing process thereof makes the large-screen monitor having individuation and attractive appearance in the same time. Among them, the large-screen monitor with three-dimensional shell is the most popular and attractive one which might lead the fashion and tread of future.

Currently used methods for manufacturing the three-dimensional shell and the pattern thereon of the smart device are described as follows: transfer printing and laser engraving after ink jet. Said transfer printing is preparing the pattern first and transferring the pattern to the target three-dimensional surface. Though the processing cost of transfer printing is low, however, the transfer printing technique has some drawback such as the slow processing speed, costly material, and the low resolution of printing. On the other side, as the name suggests, said laser engraving after ink jet is jetting the ink to the target three-dimensional surface first and then engraving the target three-dimensional surface to get the pattern by laser. This method costs high in material, equipment and processing and processes slow but with high printing resolution. The minimum resolution is up from 20 um.

Accordingly, how to provide a method to manufacture the three-dimensional shell and the pattern thereon with low processing and material cost, high processing speed and high printing resolution and a method to make colorful patterns on a three-dimensional and solid shell has become the major emphasis of the smart device firm. One technique is called photolithography which coats a photo-resist layer on the three-dimensional shell and uses light to transfer a geometric pattern to the resist layer on the curved shell. However, how to etch the three-dimensional shell by photo mask is the major direction of the related field.

SUMMARY

In order to achieve the above objective and other purposes, the present disclosure provide a method for forming a 3D pattern structure on a 3D substrate. Attaching said thin-film mask on said 3D substrate by a fitting aid and transforming the thin-film mask as a tridimensional shape to form a 3D pattern structure on a 3D substrate. After that, processing a photo resist stripping process to form desired pattern, circuit or protective thin-film on said 3D substrate directly. By using the apparatus and method of present invention, the 3D pattern structure on a 3D substrate can be mass production by the light resist technique, and increase the quality, the precision and the yield of the products.

The present disclosure provides a method for forming a 3D pattern structure on a 3D substrate, comprising: providing a 3D substrate, a thin-film mask, a fitting aid, said thin-film mask having a visible pattern which corresponding to said 3D pattern structure; forming a photo resist layer on said 3D substrate; applying a thin-film mask attaching process by said fitting aid, which attaching said thin-film mask on said 3D substrate with said photo resist layer; and carrying out a photo resist stripping process to form said 3D pattern structure on said 3D substrate.

The present disclosure further provides a device having a color photo resist pattern, comprising: a 3D substrate; at least one color photo resist layer, forming on said 3D substrate, said at least one color photo resist layer forming a visual pattern together; and at least one circuit pattern layer, forming on said visual pattern formed by said at least one color photo resist layer.

In order to make the structure and characteristics as well as the effectiveness of the present disclosure to be further understood and recognized, the detailed description of the present disclosure is provided as follows along with embodiments and accompanying figures.

DETAILED DESCRIPTION

According to the embodiments of the present disclosure, they provide a flexible material fitting aid and a hard material fitting aid to make the thin-film mask being tridimensional and paste and fit the thin-film mask on a 3D substrate closely. Therefore, the 3D substrate with the thin-film mask could fabricate 3D pattern structures on it by processing a lithography process. After that, processing a photo resist stripping process to form a thin-film layer on the 3D substrate with a photo resist pattern, and form desired pattern, circuit or protective thin-film on said 3D substrate directly in the end. Any style of the patterns which manufactured on the 3D substrate is not limited.

Next, please refer to FIG. 1A to 1D, the methods how 3D pattern structures formed on a 3D substrate according to various embodiments are disclosed.

Figure 1A:
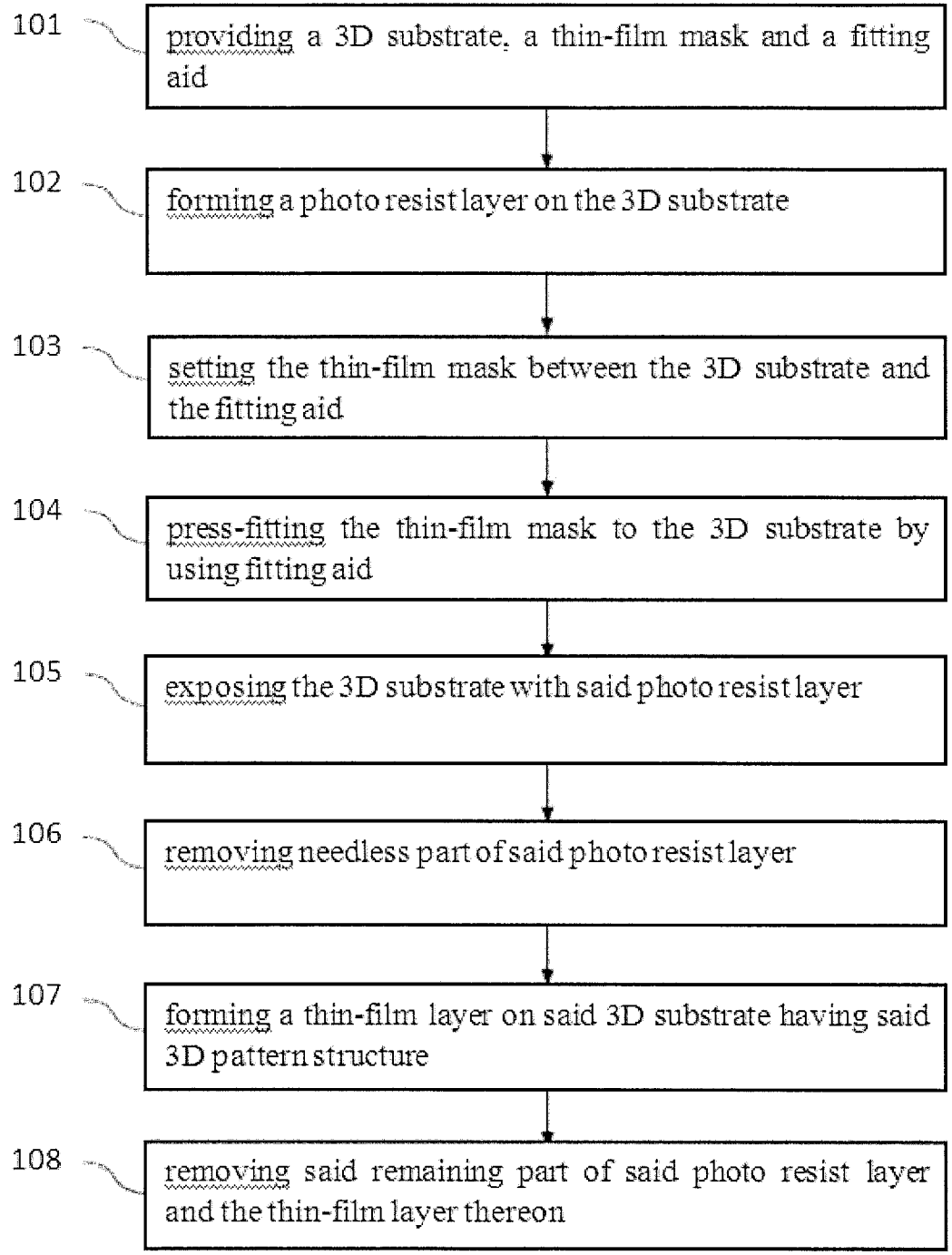
FIG. 1A to 1E show a flow chart of steps for forming a 3D pattern structure on a 3D substrate according to various embodiments of the present disclosure.

First, as shown in FIG. 1A, it is a flow chart of steps for forming a 3D pattern structures on a 3D substrate according an embodiment of present invention, the steps comprising:

Step 101: providing a 3D substrate, a thin-film mask and a fitting aid.

Step 102: forming a photo resist layer on the 3D substrate.

Step 103: setting the thin-film mask between the 3D substrate and the fitting aid.

Step 104: press-fitting the thin-film mask to the 3D substrate by using fitting aid.

Step 105: exposing the 3D substrate with said photo resist layer.

Step 106: removing needless part of said photo resist layer.

Step 107: forming a thin-film layer on said 3D substrate having said 3D pattern structure.

Step 108: removing said remaining part of said photo resist layer and the thin-film layer thereon.

Wherein, step 102 to step 104 is related to the attaching process of the thin-film mask, which applying the fitting aid to make the thin-film mask being tridimensional and to paste the thin-film mask on the 3D substrate closely. Therefore, after a lithography process, a high precision pattern on the 3D substrate is manufactured. On the other hand, step 102 to step 108 is related to a lift-off process which mixing an attaching process of the thin-film mask and called as a thin-film mask attaching and lift-off process. It is the unique technology provided by present invention.

Figure 1B:
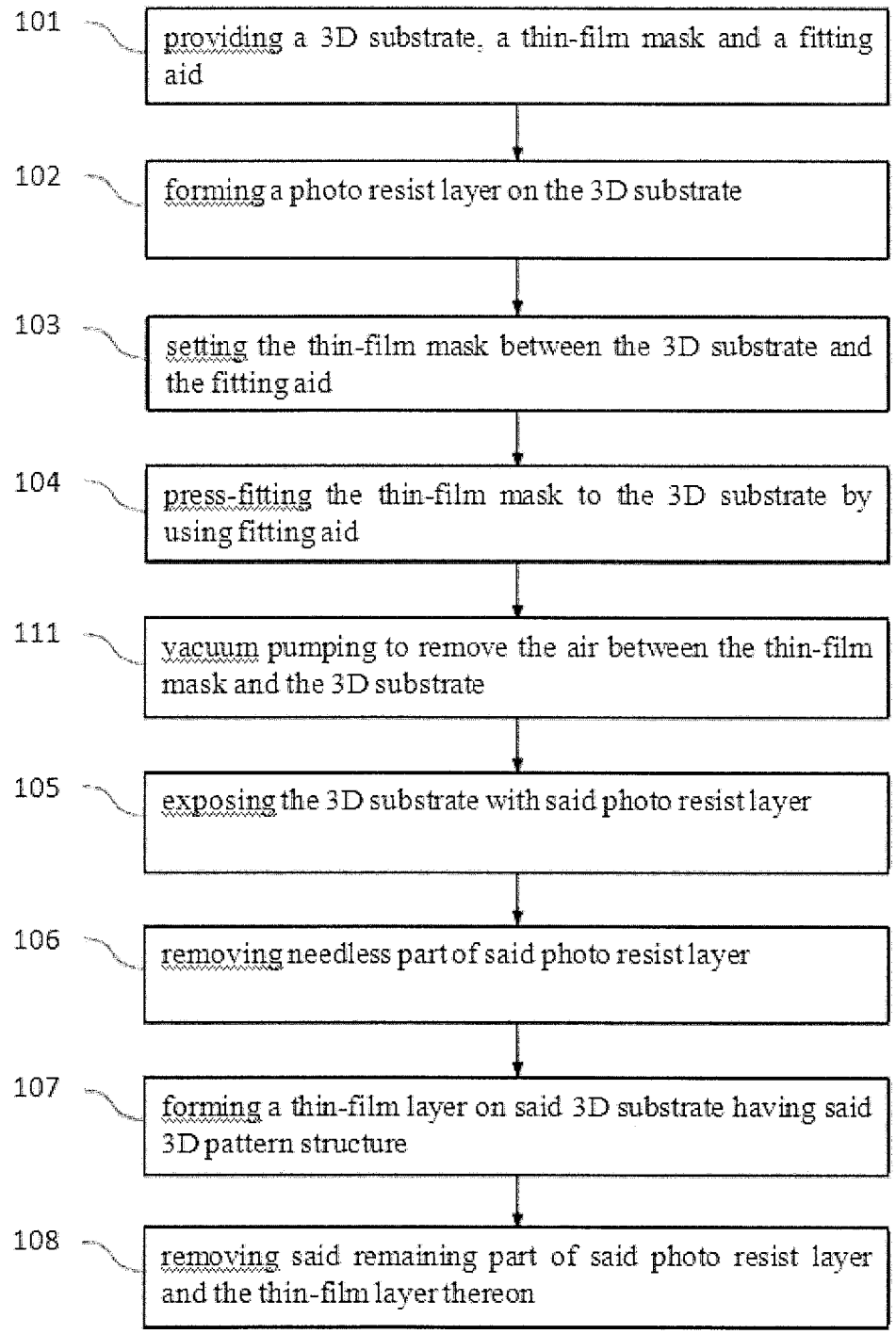

Please refer to FIG. 1B, which shows a flow chart of steps for pasting a thin-film mask to a curved substrate according another embodiment of present invention, the steps comprising:

Step 101 to step 108 which provided in the present embodiment, wherein add a step 111 after the step 104 which is vacuum pumping to remove the air between the thin-film mask and the 3D substrate. By the added step 111, the thin-film mask is much close to the 3D substrate in the attaching process.

Figure 1C:
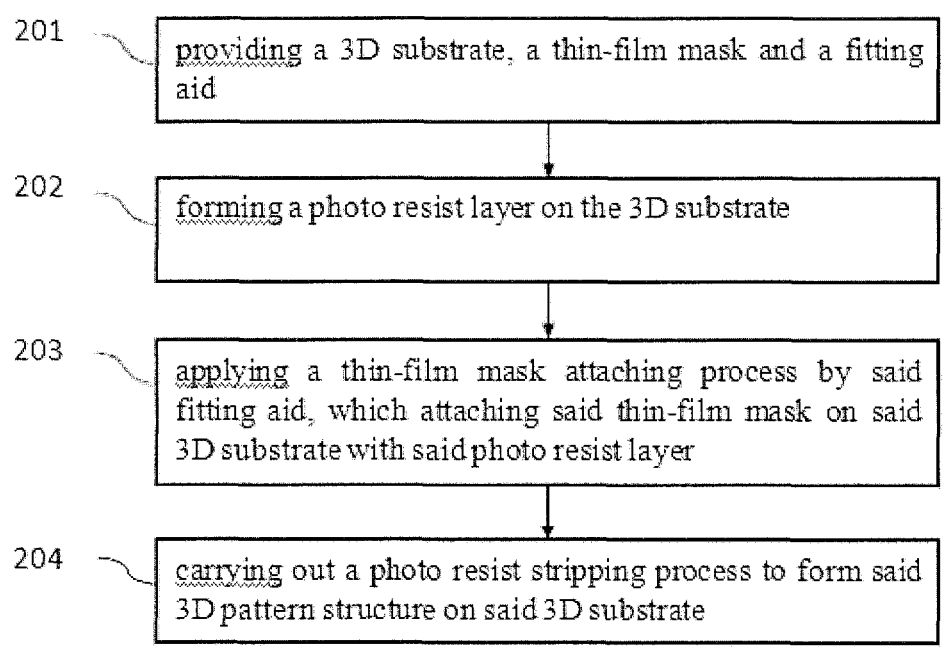

Please refer to FIG. 1C, which shows a flow chart of steps for farming a 3D pattern structures on a 3D substrate according an embodiment of present invention, which is a concentrate process of the FIG. 1A, the steps comprising:

Step 201: providing a 3D substrate, a thin-film mask and a fitting aid.

Step 202: forming a photo resist layer on the 3D substrate.

Step 203: applying a thin-film mask attaching process by said fitting aid, which attaching said thin-film mask on said 3D substrate with said photo resist layer.

Step 204: carrying out a photo resist stripping process to form said pattern structure on said 3D substrate.

Wherein, said step 203 is exactly the step 103 to step 104 of FIG. 1A and said step 204 is exactly the step 105 to step 108 of FIG. 1A.

Figure 1D:
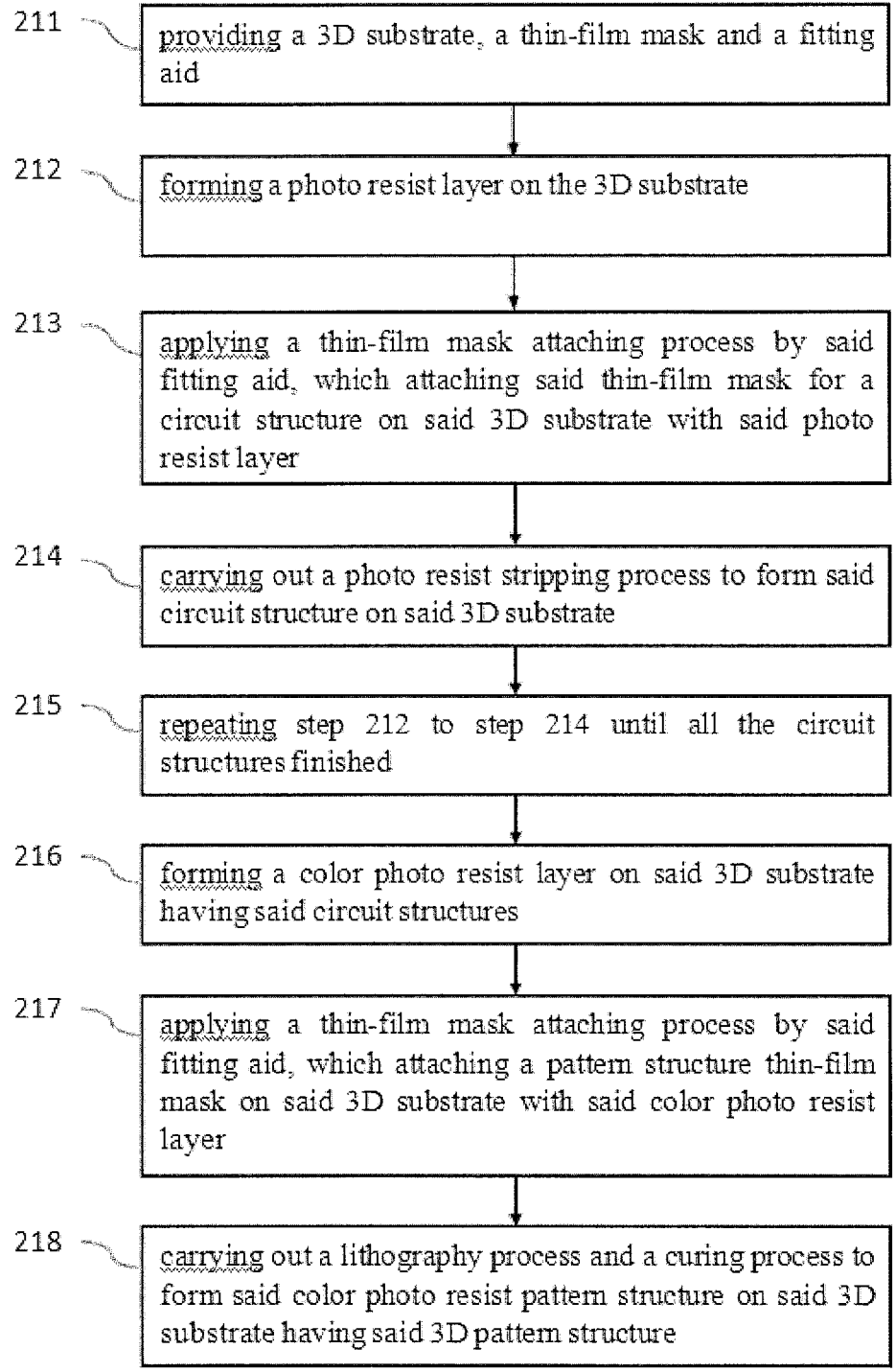

Besides, the present disclosure can further applied to form at least one circuit (e.g. a clear electrode or a metal mesh) pattern on the 3D substrate, and forming a color photo resist (permanent photo resist) on it to form the pattern layer in appearance, which is showed in the flow chart of FIG. 1D.

Please refer to FIG. 1C, which shows a flow chart of steps for forming a 3D pattern structures on a 3D substrate according an embodiment of present invention, the steps comprising:

Step 211: providing a 3D substrate, a thin-film mask and a fitting aid.

Step 212: forming a photo resist layer on the 3D substrate.

Step 213: applying a thin-film mask attaching process by said fitting aid, which attaching said thin-film mask for a circuit structure on said 3D substrate with said photo resist layer Step 214: carrying out a photo resist stripping process to form said circuit structure on said 3D substrate.

Step 215: repeating step 212 to step 214 until all the circuit structures finished.

Step 216: forming a color photo resist layer on said 3D substrate having said circuit structures.

Step 217: applying a thin-film mask attaching process by said fitting aid, which attaching a pattern structure thin-film mask on said 3D substrate with said color photo resist layer Step 218: carrying out a lithography process and a curing process to form said color photo resist pattern structure on said 3D substrate having said 3D pattern structure.

Base on the process of the FIG. 1D, it is necessary to prepare multiple thin-film masks to form a multiple layer pattern structure.

Figure 1E:
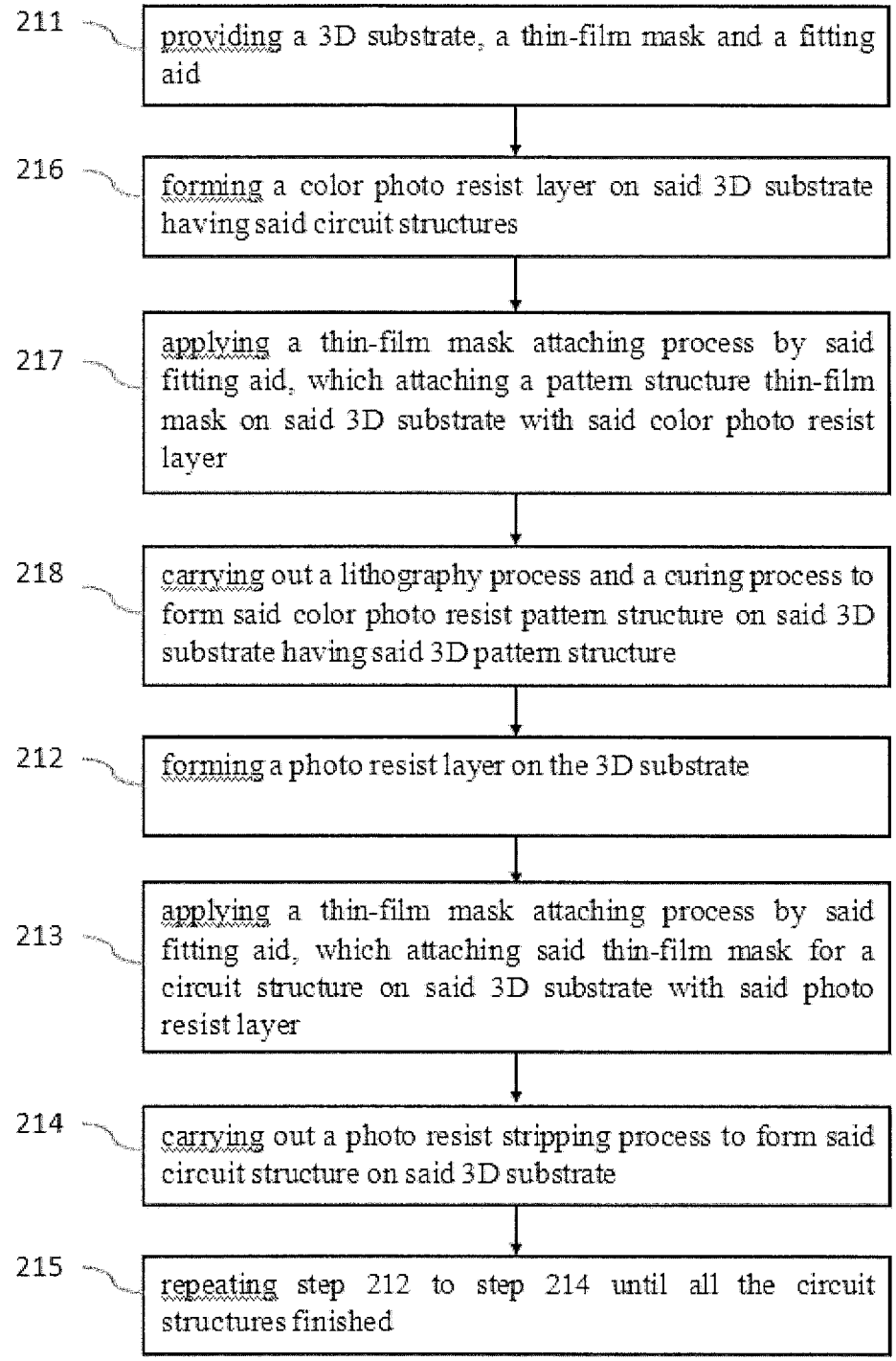

Please refer to FIG. 1E, which shows a flow chart of steps for forming a 3D pattern structures on a 3D substrate according another embodiment of present invention, the steps comprising:

Step 211: providing a 3D substrate, a thin-film mask and a fitting aid.

Step 216: forming a color photo resist layer on said 3D substrate having said circuit structures.

Step 217: applying a thin-film mask attaching process by said fitting aid, which attaching a pattern structure thin-film mask on said 3D substrate with said color photo resist layer Step 218: carrying out a lithography process and a curing process to form said color photo resist pattern structure on said 3D substrate having said 3D pattern structure.

Step 212: forming a photo resist layer on the 3D substrate.

Step 213: applying a thin-film mask attaching process by said fitting aid, which attaching said thin-film mask for a circuit structure on said 3D substrate with said photo resist layer Step 214: carrying out a photo resist stripping process to form said circuit structure on said 3D substrate.

Step 215: repeating step 212 to step 214 until all the circuit structures finished.

The different between the process of FIG. 1D and the process of FIG. 1E is that the manufacture of the color photo resist is the first thing to do in the process of FIG. 1E, and forming circuit structures of the thin-film layer after that. Both two ways can finish a multiple layer pattern structure.

Wherein, in the process of the FIG. 1D and FIG. 1E, it could further comprise the step that forming a the protective layer on the color photo resist and/or the circuit structures after they finished.

Besides, in the fitting-pasting process, it provides a fitting aid composed of flexible materials or hard materials which illustrated in the following embodiment. Wherein, said flexible materials as the material of the fitting aid is selected from such as the silica gel with lamination bonding or other flexible materials with porous property to help the thin-film mask fit on the 3D substrate having color photo resist layer. Base on the characteristics mentioned above, the fitting aid could paste on the thin-film mask closely and forming a three layer structure is composed of the fitting aid, the thin-film mask and the 3D substrate to process a lithography process. Also, if the refractive index of the material of fitting aid is greater than the air, the effect of the exposure will be better because of the collimation of the light incident to the curved substrate is raised during the lithography process.

Figure 2A:
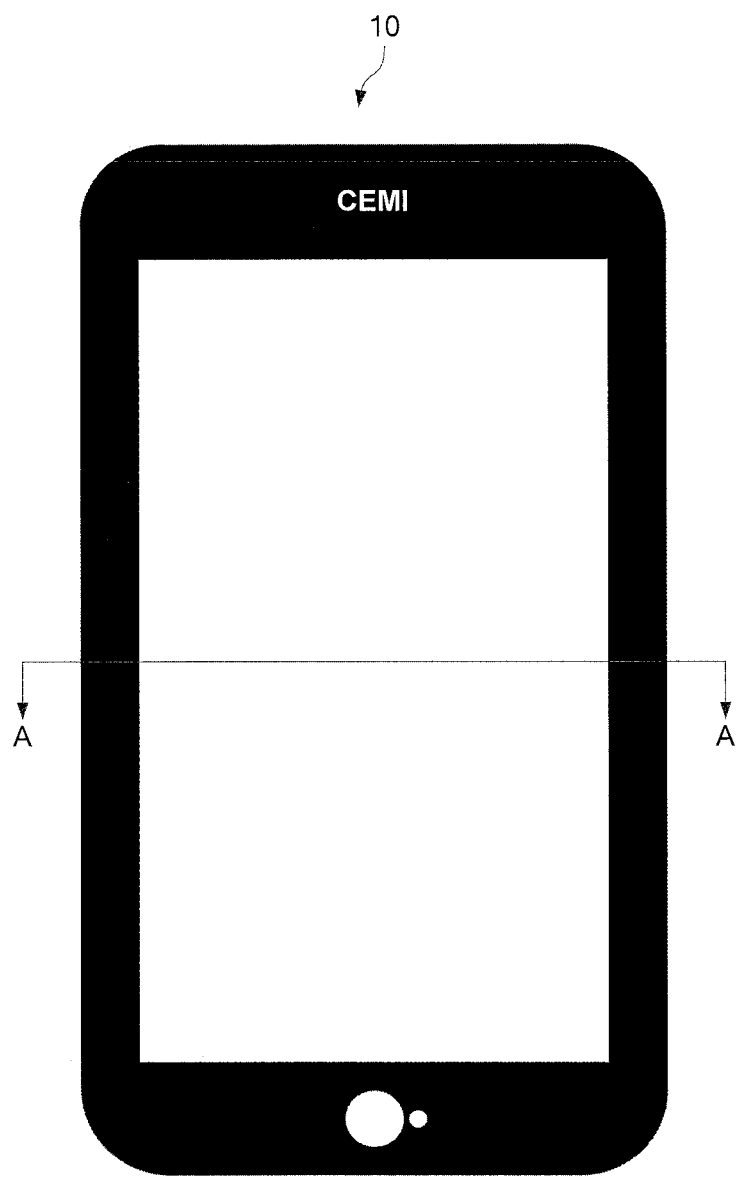
FIGS. 2A and 2B show a top view and a cross-sectional view of the 3D shell fabricated by the method of the present disclosure.
Figure 2B:
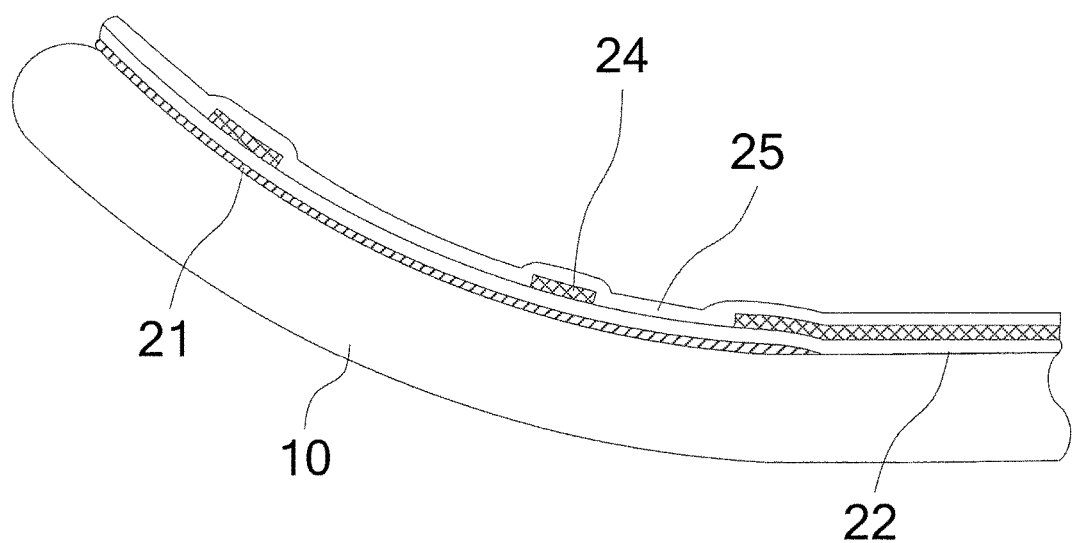

Refer to FIGS. 2A and 2B, which are a top view and a cross-sectional view of the tridimensional shell 1 which fabricated by the skill of the present disclosure, wherein FIG. 2B is a cross-sectional view along the A-A cut of the FIG. 2A. It can be obviously figured out that a multiple pattern structure can be formed on the 3D substrate 10 by the technique provided by the present disclosure, the construction of the multiple pattern structure from in sequence from the bottom to the top is color photo resist layer 21, first protective layer 22, circuit pattern 24, second protective layer 25. Wherein said color photo resist layer 21 is distributed on the plane position and solid position of the 3D substrate 10; said first protective layer 22 is covered on the color photo resist layer 21 and the 3D substrate 10; said circuit pattern 24 is covered on the plane position and solid position of the first protective layer 22; and second protective layer 25 is covered on the circuit pattern 24.

However, the preparation of the 3D pattern structure on the 3D substrate is quite difficult without the technique provided by the present disclosure. The lack of the precision of traditional screen printing results in a poor resolution of the 3D surface pattern and fails to meet the high resolution need of consumer electronics. Comparatively speaking, the present disclosure provides a high precision thin-film layer fitting process and a photo resist stripping process to set up an excellent and non-etching process to form a thin-film mask fitting perfectly on the color photo resist layer of the 3D substrate 10. After that, the high resolution 3D pattern structure of FIG. 2A and the transparent circuit pattern thereon could be made.

Next, referring to FIG. 3A to FIG. 7H of the present disclosure to illustrate the fitting apparatus and methods of the present disclosure, especially the thin-film mask, the fitting aid and the fitting fixture used to paste the thin-film mask precisely and closely.

Figure 3A:
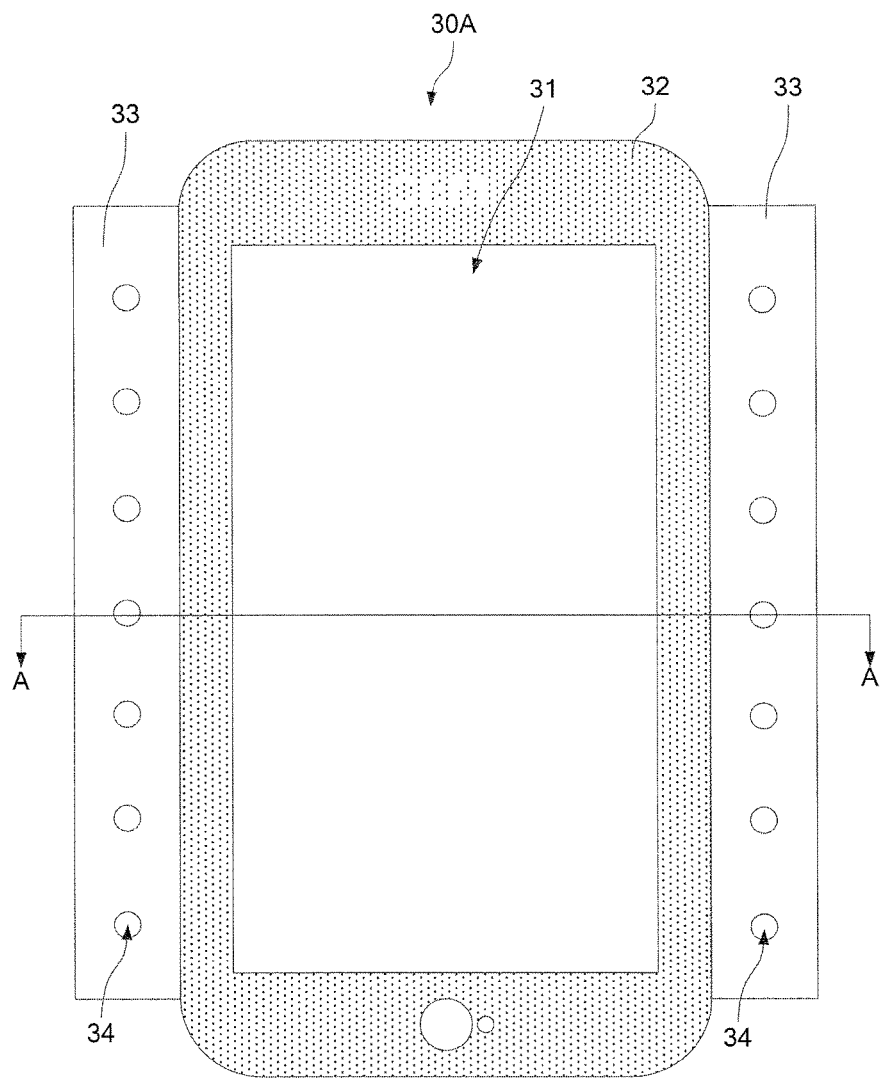
FIGS. 3A and 3B show a top view and a cross-sectional view of the thin-film mask applying on the positive resist according to an embodiment of the present disclosure.
Figure 3B:
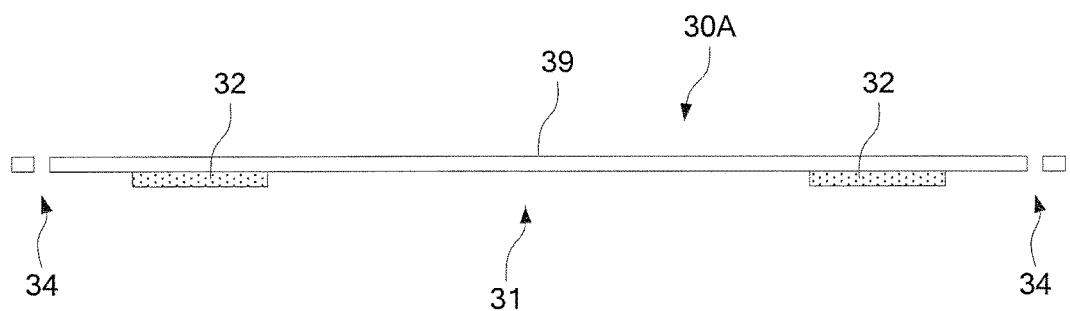
Figure 4A:
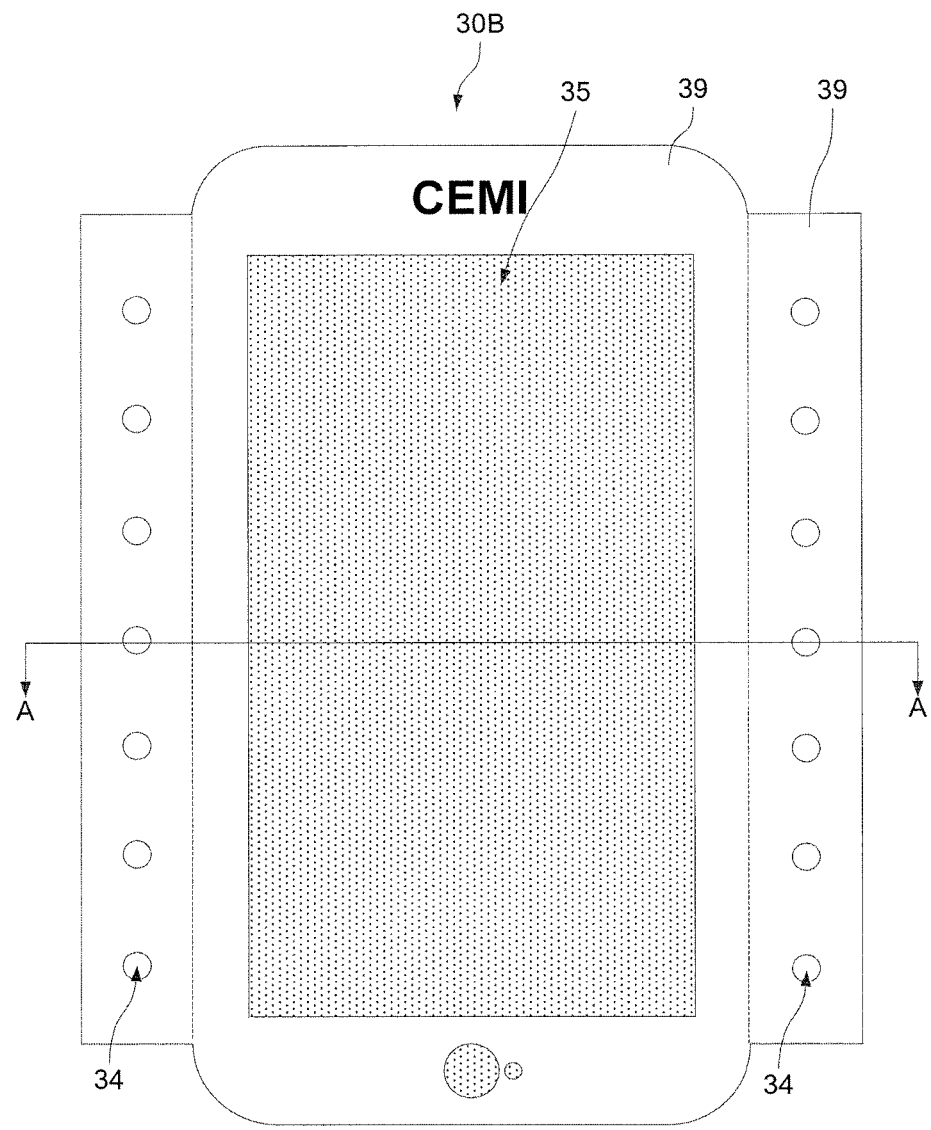
FIGS. 4A and 4B show a top view and a cross-sectional view of the thin-film mask applying on the negative resist according to another embodiment of the present disclosure.
Figure 4B:
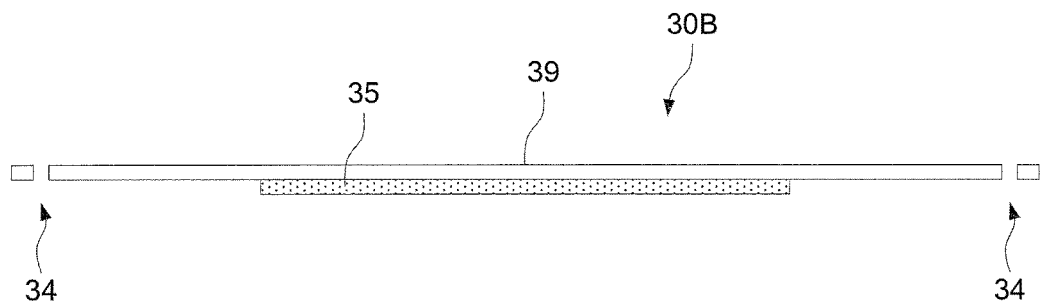

Refer to FIG. 3A and FIG. 3B of the present disclosure, wherein FIG. 3B is a cross-sectional views along the A-A cut of FIG. 3A, which show a thin-film mask example used for the positive resists. In the other side, FIG. 4A and FIG. 4B show an example that the thin-film mask is used for the positive resists, wherein FIG. 4B is a cross-sectional views along the A-A cut of FIG. 4A. As the figures tell, the thin-film masks cover areas of two embodiments are in direction opposition.

The thin-film mask 30A of FIG. 3A and FIG. 3B comprising a thin-film matrix 39 and a thin-film mask layer 32 formed thereon. The thin-film mask 30A of FIG. 4A and FIG. 4B comprising a thin-film matrix 39 and a thin-film mask layer 35 formed thereon. Said thin-film matrix 39 is composed of a flexible material, such as PET. And the thin-film mask layer 32, 35 formed on the thin-film matrix 39, having a visible pattern and used to attach to the color photo resist layer of the 3D substrate, wherein the thickness of the thin-film material 39 is between 1 micrometer and 100 micrometers, the thickness of the thin-film mask layer is between 10 nanometers and 3000 nanometers. The thin-film mask layer 32, 35 is composed of the metal materials and has high flexibility when the thickness is ranged from 10 micrometers to 3000 micrometers, thus it is suitable for applying on the 3D surface. In addition, the thin-film matrix 39 comprising a plurality of positioning holes for positioning and aligning the thin-film matrix to the 3D substrate.

Figure 5A:
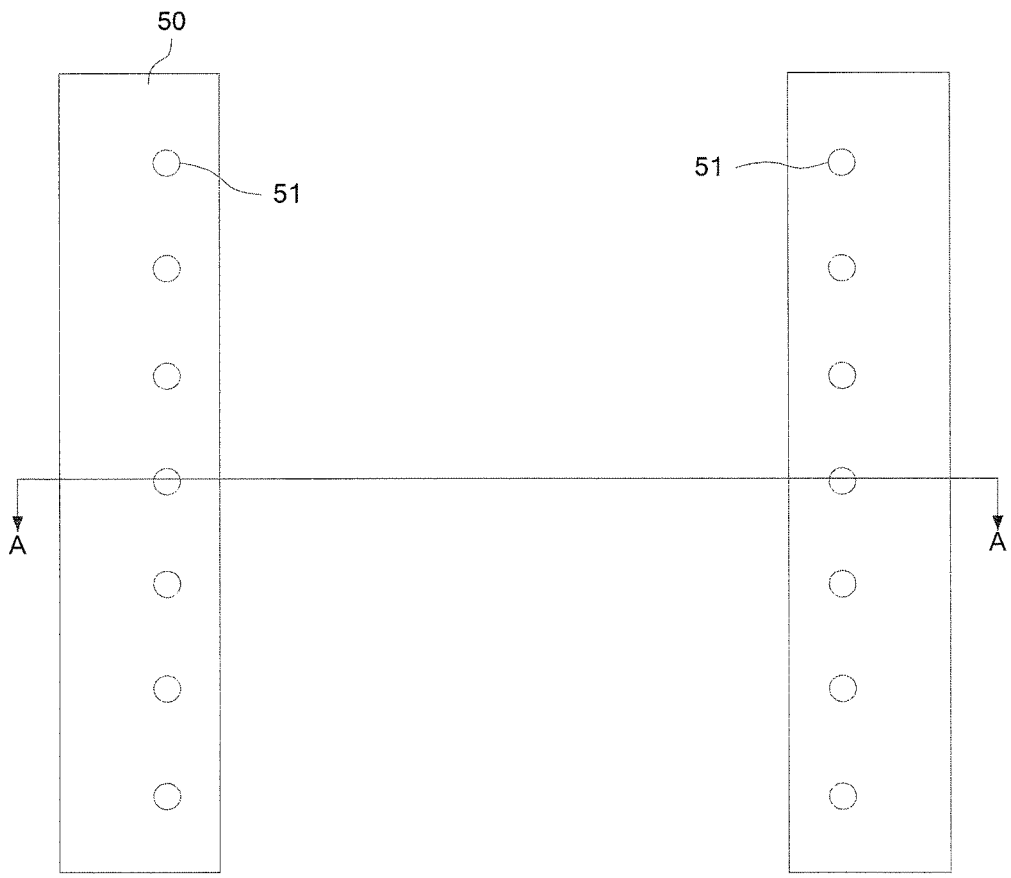
FIGS. 5A and 5B show a top view and a cross-sectional view of the fitting fixture according to an embodiment of the present disclosure.
Figure 5B:

Next, please refer to FIG. 5A and FIG. 5B, which shows top view and a cross-sectional view of a fitting fixture according to an embodiment of the present disclosure. As shown in the figure, the fitting fixture 50 having a plurality of position latch 51 corresponding to the position holes 34 of the thin-film mask 30A, 30B. Therefore, the fitting fixture 50 can hold the thin-film mask 30A, 30B truly and help them position precisely.

Figure 6A:
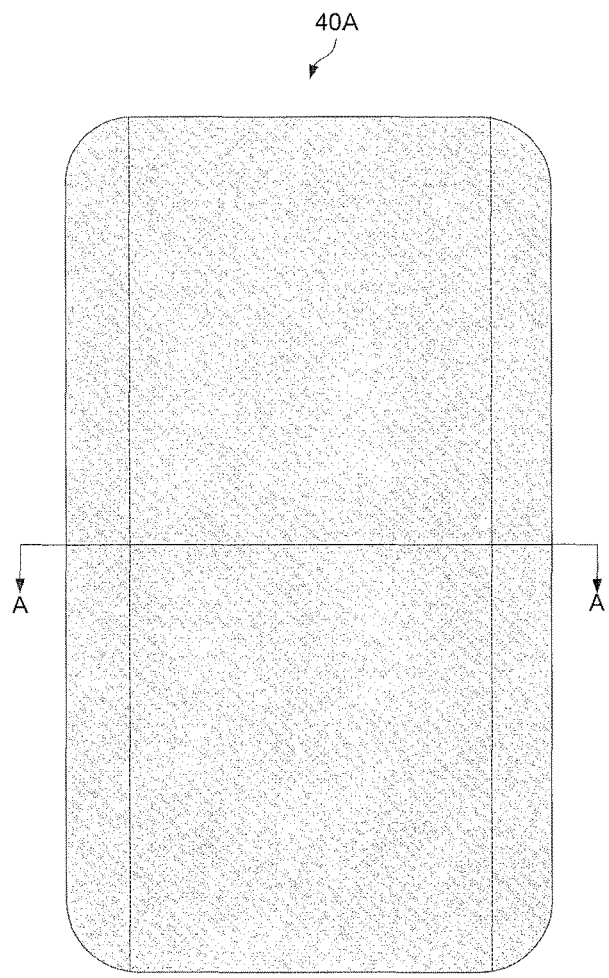
FIG. 6A shows a top view of the fitting aid according to an embodiment of the present disclosure.
Figure 6B:
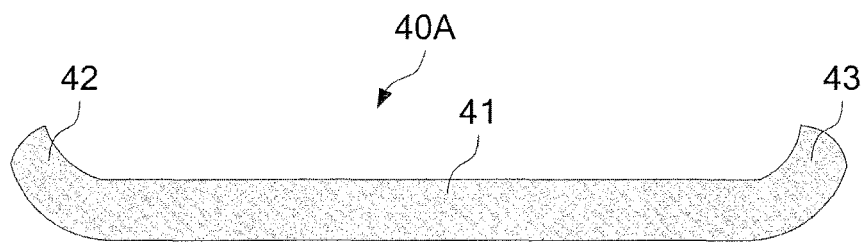
FIG. 6B to 6D show cross-sectional views along the A-A cut of the fitting aid according to various embodiments of the present disclosure.
Figure 6C:
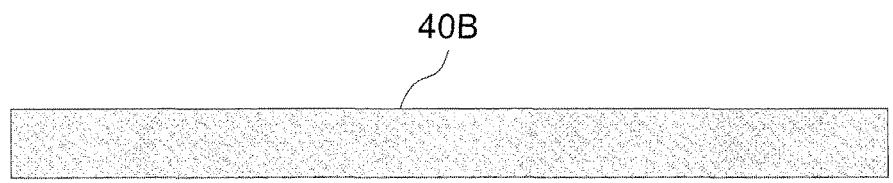
Figure 6D:
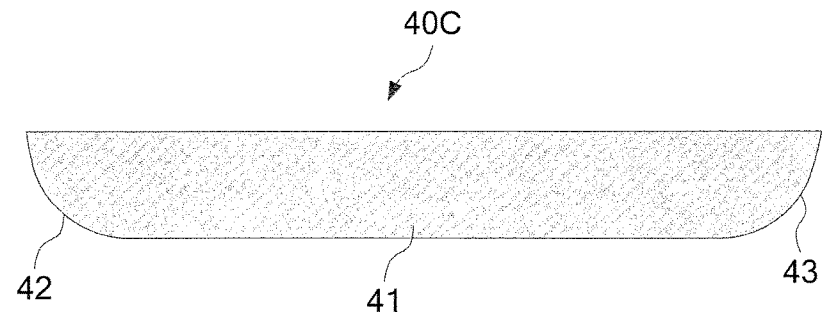

Please refer to FIG. 6A to 6D, which shows a top view of the fitting aid according to an embodiment and the cross-sectional views along the A-A cut of various type of fitting aid of the present disclosure. As shown in FIG. 6B, the shape of fitting aid comprising a forming bottom 41, a first three-dimension side 42 and a second three-dimension side 43 is prepared previously to fit the 3D substrate 10 for enhancing the processing speed. In other preferred embodiments, as shown in FIG. 6C and 6D, the fitting aid could be a planar structure (40B) or a designed structure having a three-dimension bottom matching with the 3D substrate 10 (40C). The fitting aid is composed of single material, however, it could also be formed in different shapes by other different materials, such as silicone, silicone oil coated soft outer layer material, silicon organic material, fluorine-containing organic material or the mixture thereof. Base on the properties of those materials, the fitting aid could be a well deformation to help the thin-film mask fit on the 3D surface 10.

It can be seen from the embodiments mentioned above that the efficiency will increase if the fitting aid is composed of an elastic material with high transmittance, such as could be passed through by the light having a wavelength between 300 nanometers and 500 nanometers. The collimation of the following exposure process increases as the material properties of the high transmittance elastic material, jointly, the printing resolution of the exposure process increases as well.

Next, please refer to FIG. 7A to FIG. 7H, which show a flow chart in cross-sectional view of fitting a thin-film mask to a curved substrate according to an embodiment of FIG. 1B of the present disclosure. In the embodiment, the fitting aid 40A and the thin-film mask 30A for positive resists layer 20A are used.

Figure 7A:
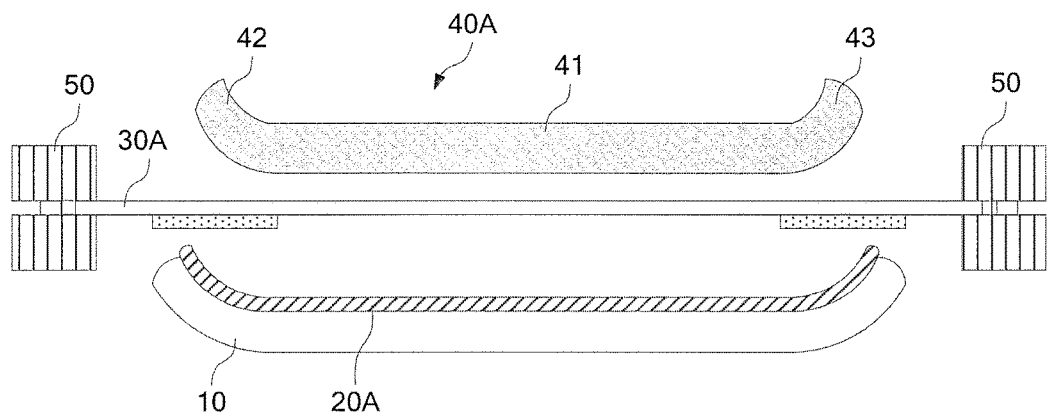
FIG. 7A to 7K show a flow chart in cross-sectional view of fitting a thin-film mask to a curved substrate according to an embodiment of FIG. 1B of the present disclosure.

First, as shown in FIG. 7A, the fitting fixture 50 hold the thin-film mask 30A to position precisely to the 3D surface 10 with positive resist layer 20A, and the fitting aid 40A is prepared to press and to fit after that. The figure externalize the step 111 and step 112 of FIG. 1B which says providing a curved substrate having a color photo-resist layer, a thin-film mask and a fitting aid, wherein the fitting aid is composed by flexible material, and setting the thin-film mask between the 3D substrate and the fitting aid.

Figure 7B:
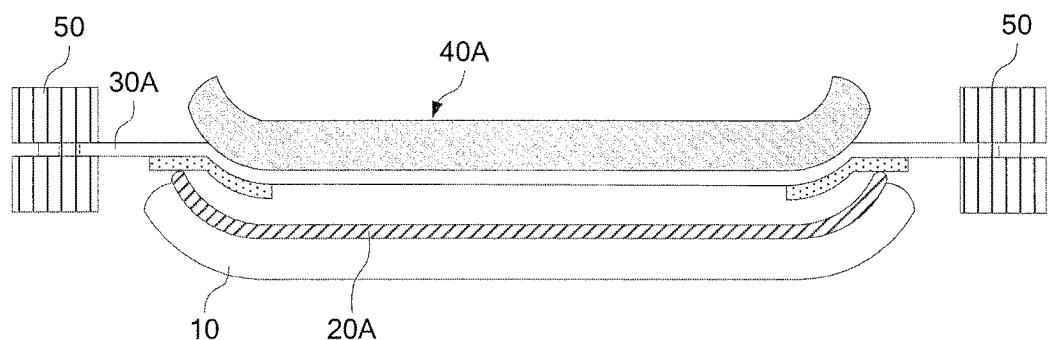
Figure 7C:
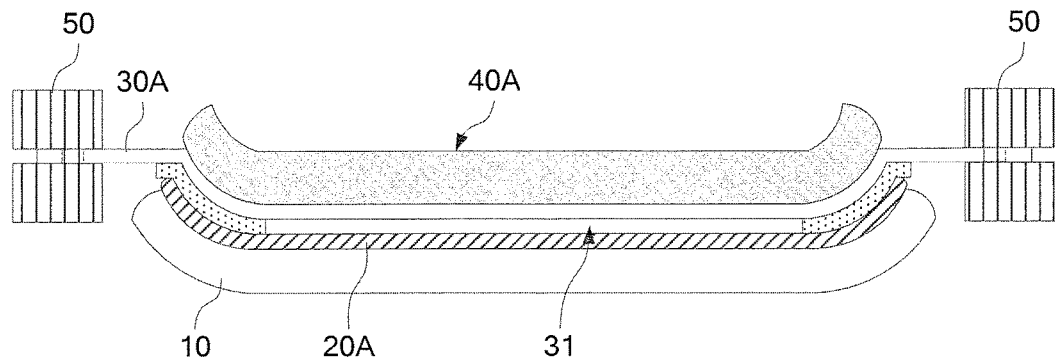

Next, as shown in FIGS. 7B and 7C, the thin-film mask 30A becomes deformed and fits to the 3D surface 10 while the fitting aid 40A keeps pressing on them. At this time, the positive resist layer 20A of the 3D substrate 10 and the thin-film mask layer 32 of the thin-film mask 30A are fitting together, and supported by the air of the hollow area 31 which formed between the thin-film mask 30A and the positive resist layer 20A, which exactly express the meaning of step 113 FIG. 1B that press-fitting the thin-film mask to the thin-film mask on the curved substrate by using fitting aid.

Figure 7D:
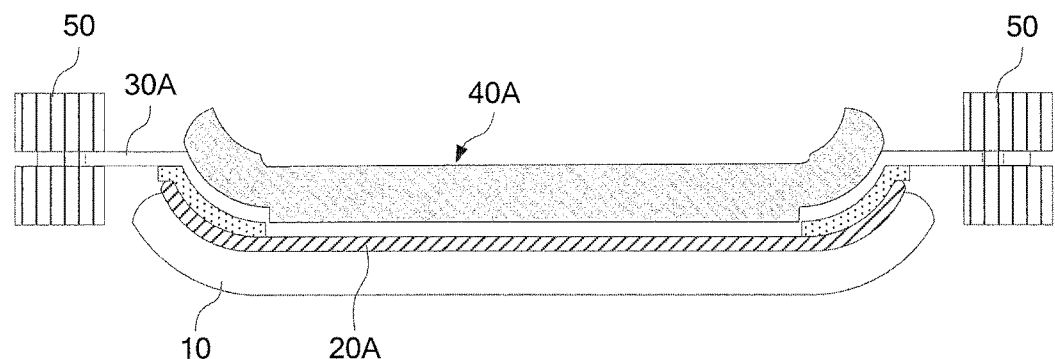

Next, as mentioned in step 111 of FIG. 1B, it processes a vacuum pumping method to remove the air between the thin-film mask and the 3D substrate. Refer to FIG. 7D, the air of the hollow area 31 between the thin-film mask 30A and the positive resist layer 20A in FIG. 7C would be removed, which results in the fitting aid 40A with flexible material deformed again to fill the space. Therefore, the fitting aid 40A, the thin-film mask 30A and the positive resist layer 20A would tightly fit to each other temporarily. It would bring the advantages for the following lithography process.

Figure 7E:
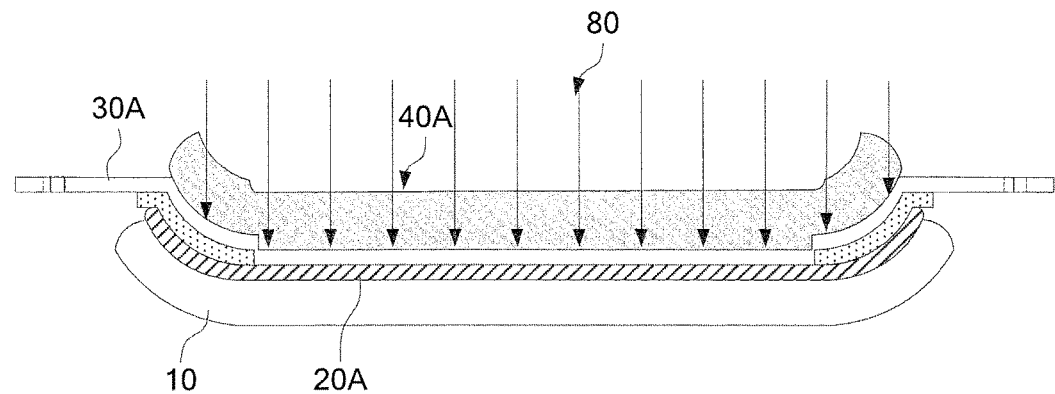

At last, removing the fitting fixture 50 as shown in FIG. 7E, then the exposure device could process the lithography by applying the ultraviolet light.

Figure 7F:
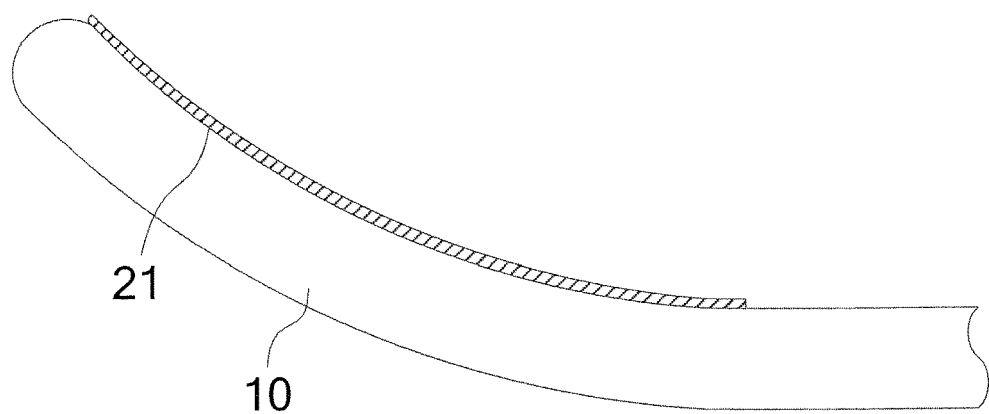

After processing the lithography process, the whole device is remaining the 3D substrate 10 and the color photo resist layer 21 fitted thereon, which is shown in FIG. 7F. Then, the second protective layer 22 is formed on it and curing after that, as the structure shown in FIG. 7G.

Figure 7G:
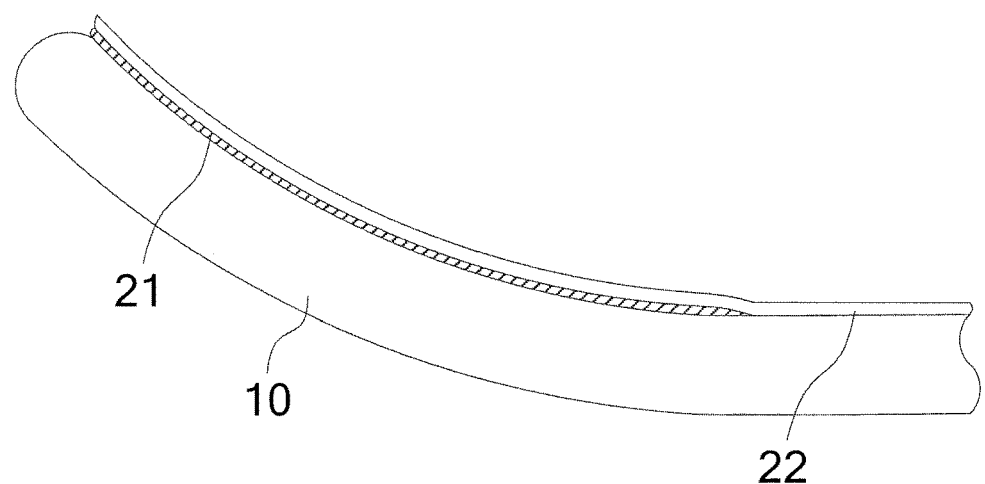
Figure 7H:
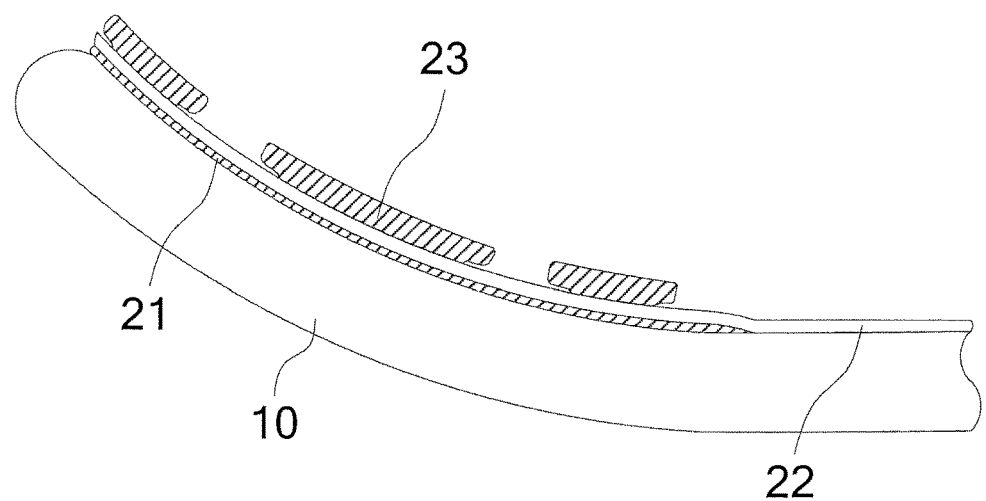
Figure 7I:
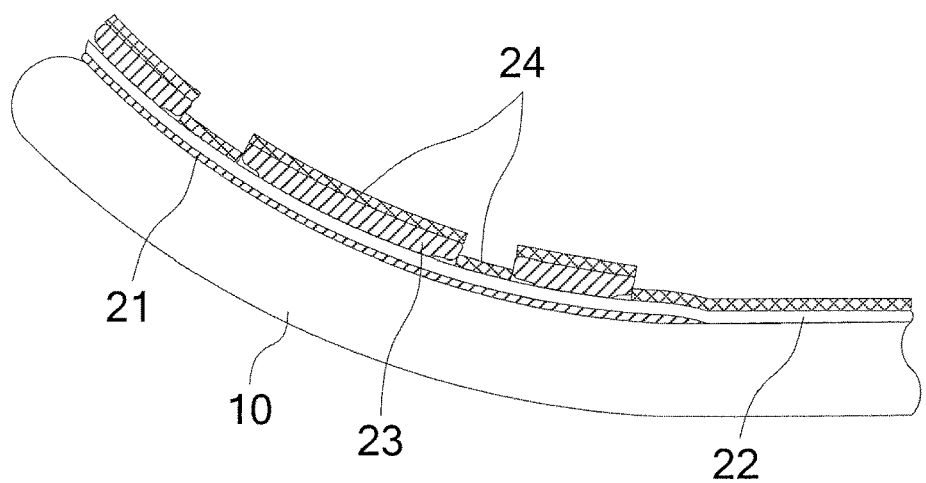
Figure 7J:
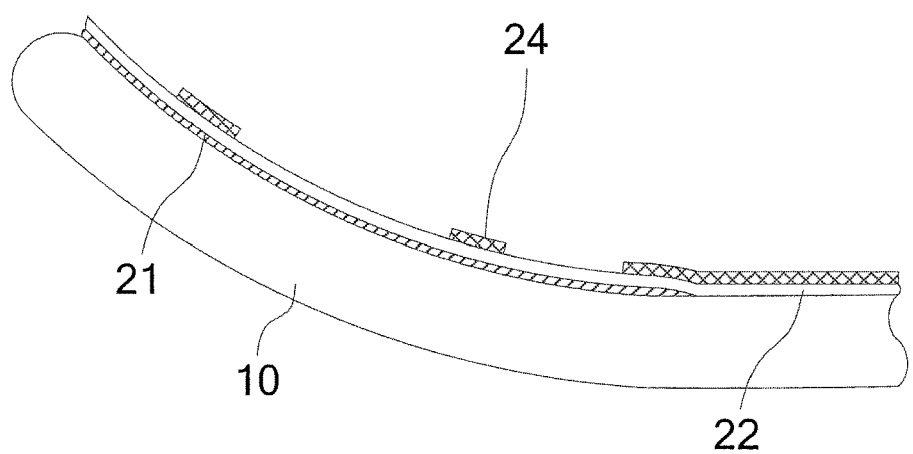
Figure 7K:
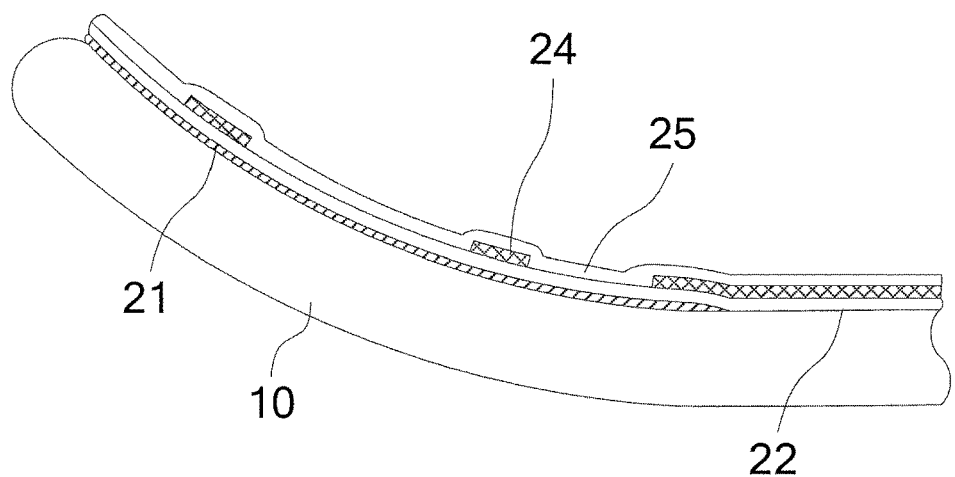

Then, forming the photo resist layer 23 which is necessary to forming a circuit pattern by the thin-film mask fitting process shown in FIG. 7A-7E, for example, forming a undermined concave corner on the edge by the negative photo-resist layer makes the negative photo-resist layer strip easier during a lift-off procedure, which is shown as FIG. 7H. After that, forming a thin-film layer on the 3D substrate 10 having photo resist layer 23 as shown in FIG. 7I. Because of the photo resist layer 23 is a negative photo-resist layer having the undermined concave corner on the edge, the thin-film layer formed on the photo resist layer 23 would be removed while the photo resist layer 23 is removed, therefore, a remaining part of said photo resist layer and the thin film layer which corresponding to said 3D pattern structure would form a circuit pattern 24, which shown in FIG. 7J. Last, forming a second protective layer 25 on the circuit pattern 24 to finish the construction of the multilayer 3D pattern, which shown in FIG. 7K.

All everything else equal, FIG. 8A to FIG. 8E show a embodiment using a negative photo-resist layer 20B and a corresponding thin-film mask 30B thereof to forming a curved surface pattern. The process and the remarkable fact of negative resist embodiment is similar to the positive resist one shown on FIG. 7A to FIG. 7E, thus, no more tautology here. The different between those two embodiments is the positions where the thin-film mask 30A, 30B having a deformation is different which results from the thin-film mask layer 35 and the thin-film mask layer 32 are locating on the different position. However, though the deformation part is different, the thin-film mask 30B could still having a corresponding deformation suitable for negative resist use after the pressing pressure of the flexible fitting aid 40A and the air removing by vacuum pumping step.

Figure 8A:
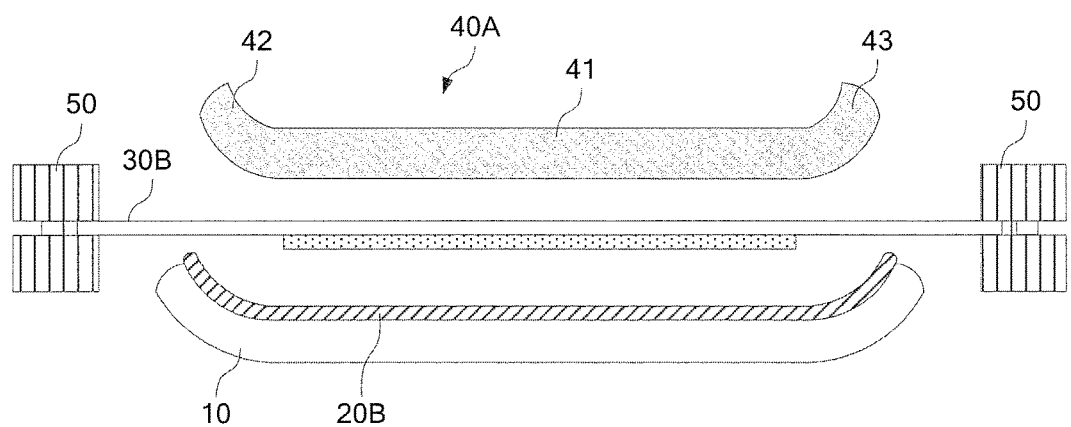
FIG. 8A to 8K show a flow chart in cross-sectional view of fitting a thin-film mask to a curved substrate according to another embodiment of FIG. 1B of the present disclosure.
Figure 8B:
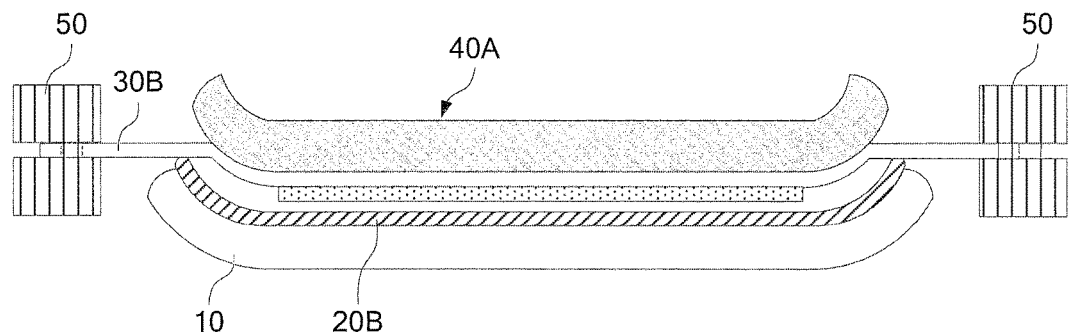
Figure 8C:
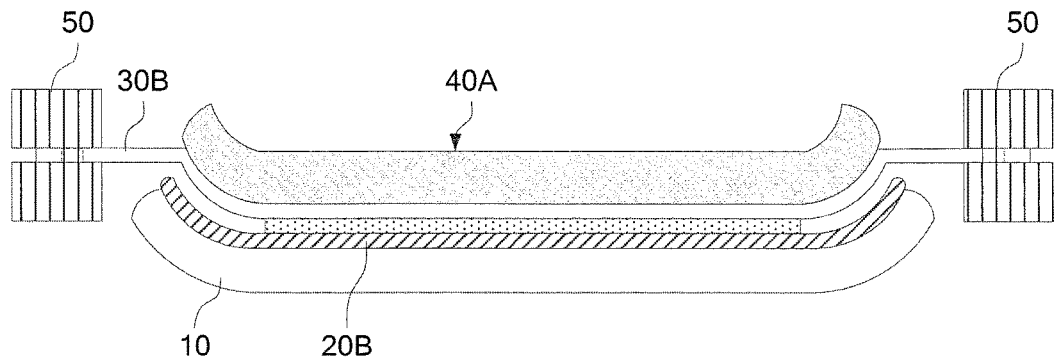
Figure 8D:
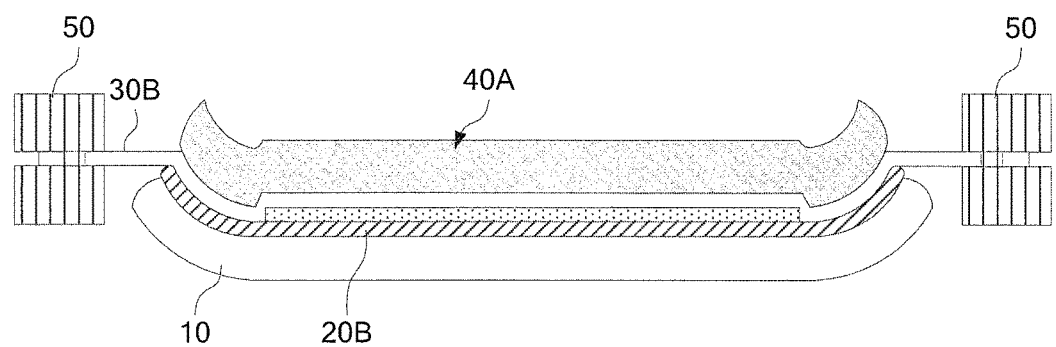
Figure 8E:
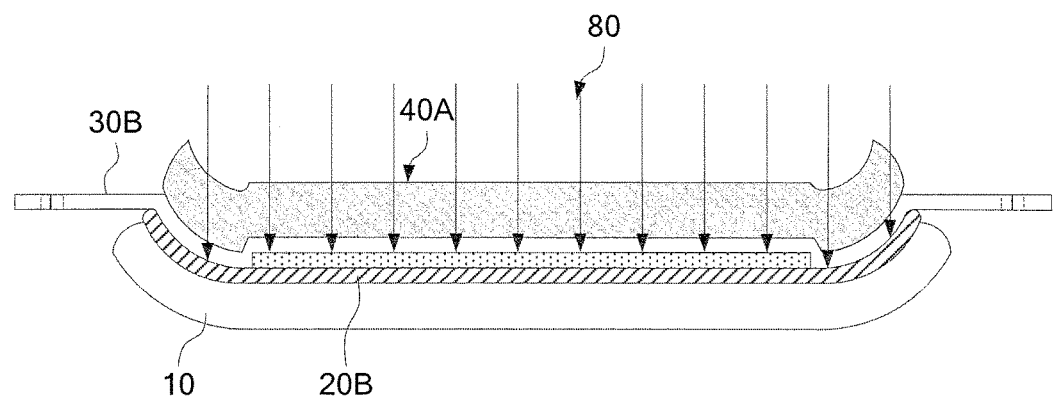
Figure 8F:
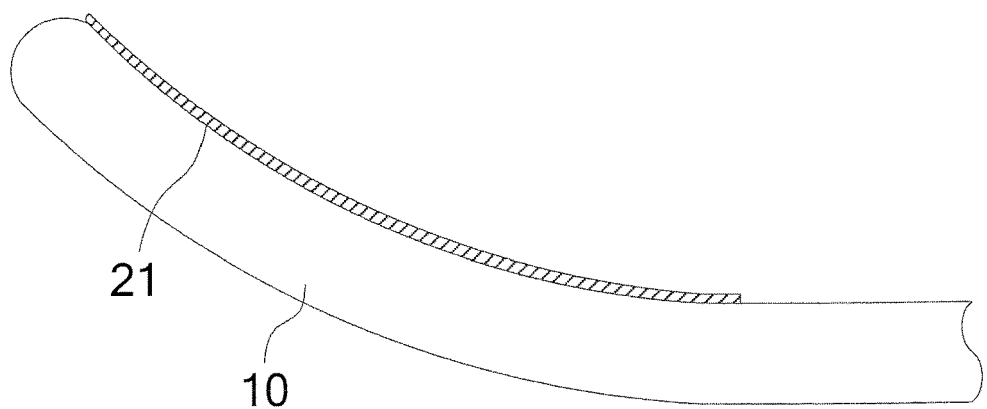
Figure 8G:
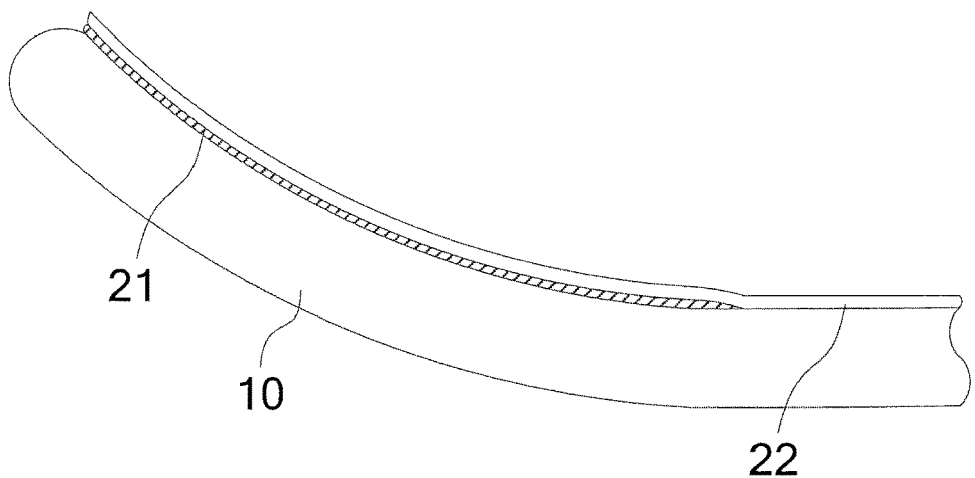

After processing the lithography process, the whole device is remaining the 3D substrate 10 and the color photo resist layer 21 fitted thereon, which is shown in FIG. 8F. Then, the second protective layer 22 is formed on it and curing after that, as the structure shown in FIG. 8G.

Figure 8H:
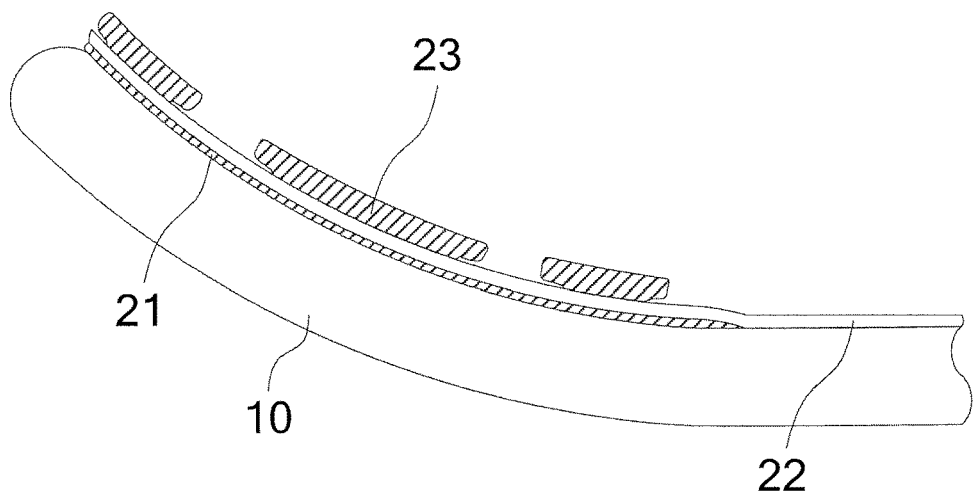
Figure 8I:
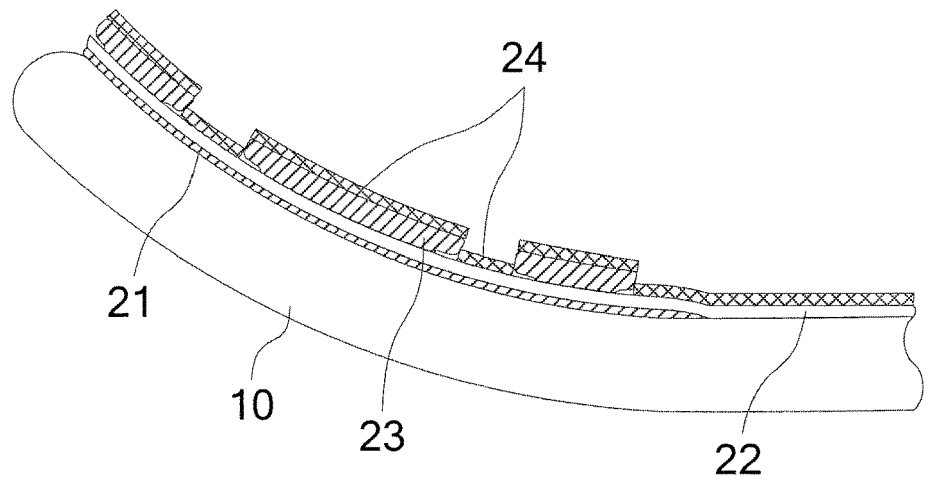
Figure 8J:
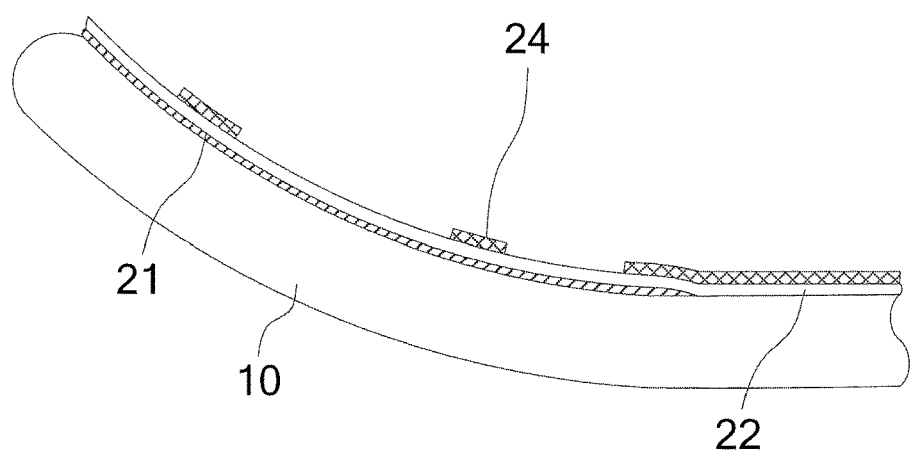
Figure 8K:
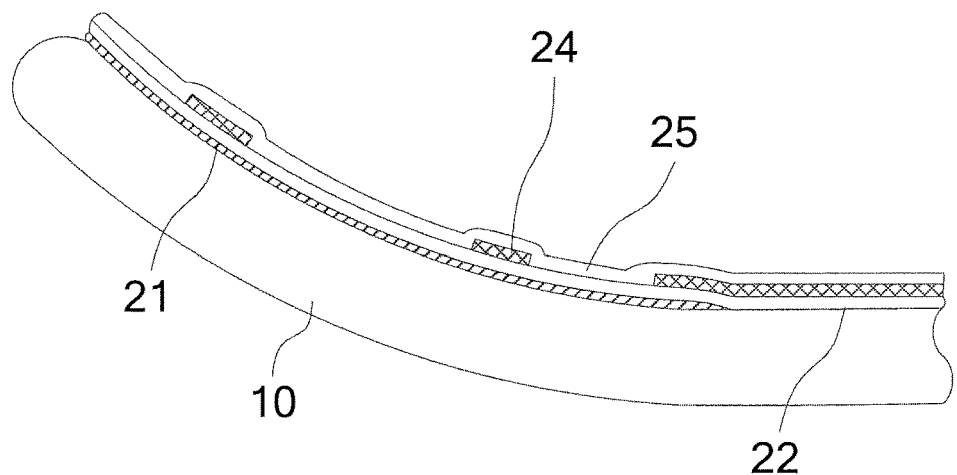

Then, forming the photo resist layer 23 which is necessary to forming a circuit pattern by the thin-film mask fitting process shown in FIG. 8A-8E, for example, forming a undermined concave corner on the edge by the negative photo-resist layer makes the negative photo-resist layer strip easier during a lift-off procedure, which is shown as FIG. 8H. After that, forming a thin-film layer on the 3D substrate 10 having photo resist layer 23 as shown in FIG. 8I. Because of the photo resist layer 23 is a negative photo-resist layer having the undermined concave corner on the edge, the thin-film layer formed on the photo resist layer 23 would be removed while the photo resist layer 23 is removed, therefore, a remaining part of said photo resist layer and the thin film layer which corresponding to said 3D pattern structure would form a circuit pattern 24, which shown in FIG. 8J. Last, forming a second protective layer 25 on the circuit pattern 24 to finish the construction of the multilayer 3D pattern, which shown in FIG. 8K.

Next, please refer to FIG. 9A to FIG. 9E, they illustrate a different embodiment which applying other kind of the fitting aid 40B to help the thin-film mask 30A paste on the curved surface closely. In the embodiment, the fitting aid 40B is a simply planar structure and the exterior of the fitting aid is not adjusted before use. However, it does not affect the effect of the fitting aid. Base on the characteristics of the flexible material of the fitting aid 40B, a planar structure fitting aid 40B could still have a corresponding deformation by an outer force to help the thin-film mask 30A pasting closely to the curved substrate 10 while the thin-film mask is attached to the 3D substrate.

Figure 9A:
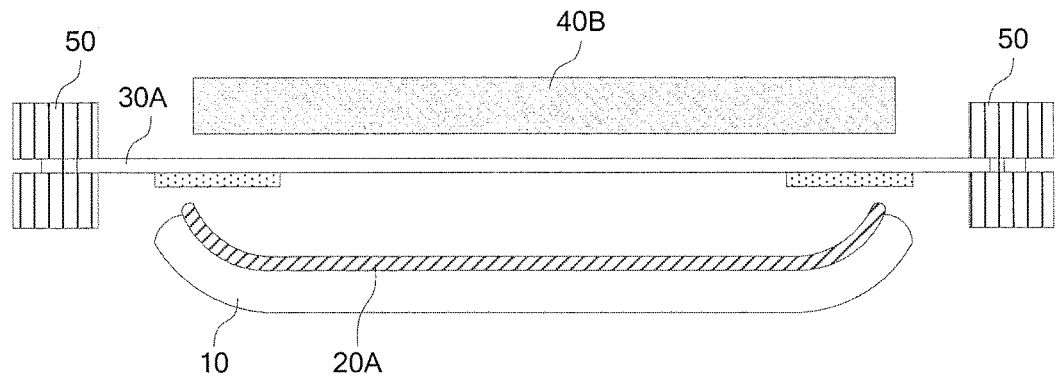
FIG. 9A to 9K show a flow chart in cross-sectional view of fitting a thin-film mask to a curved substrate according to further another embodiment of FIG. 1B of the present disclosure.
Figure 9B:
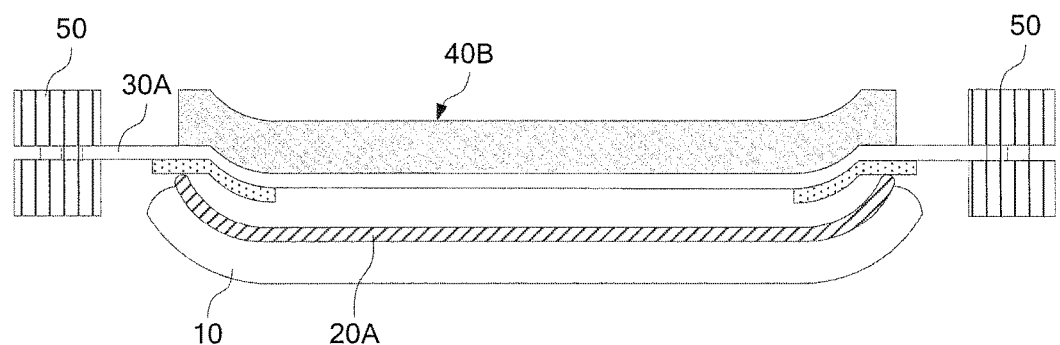
Figure 9C:
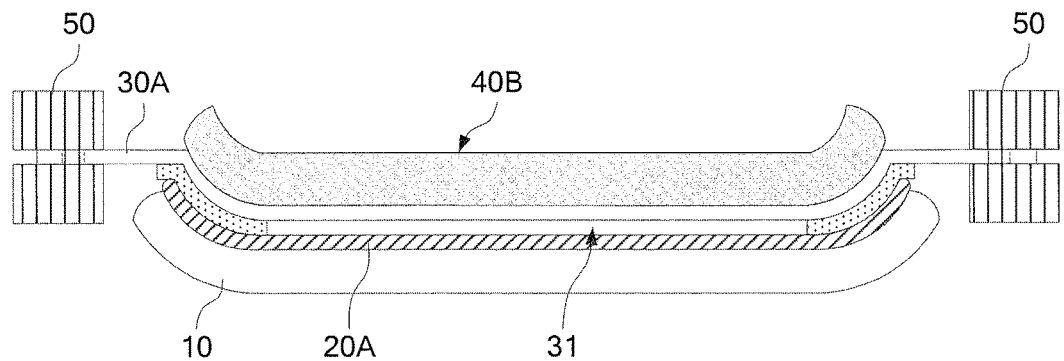
Figure 9D:
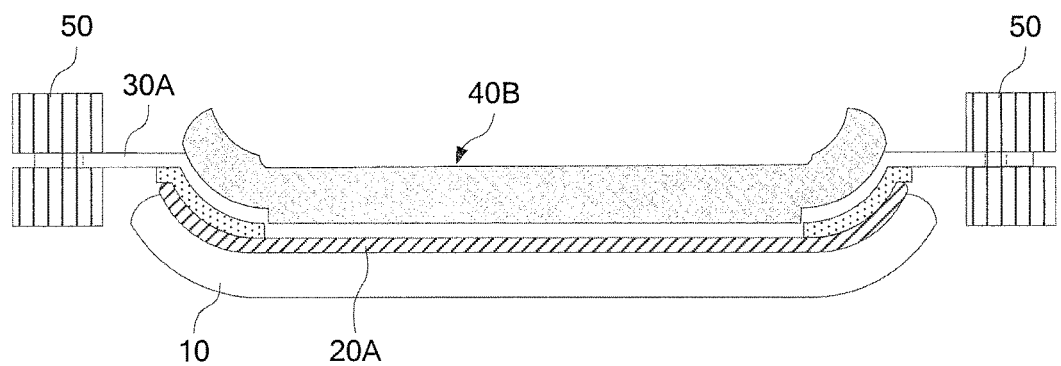
Figure 9E:
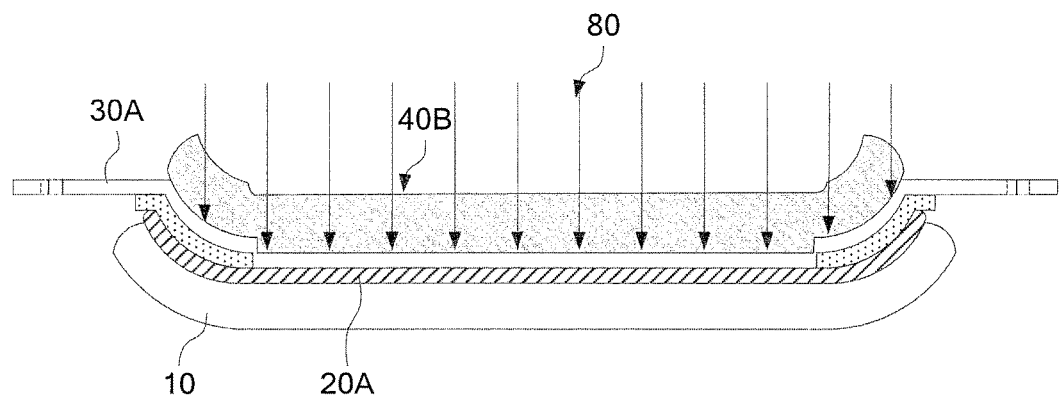
Figure 9F:
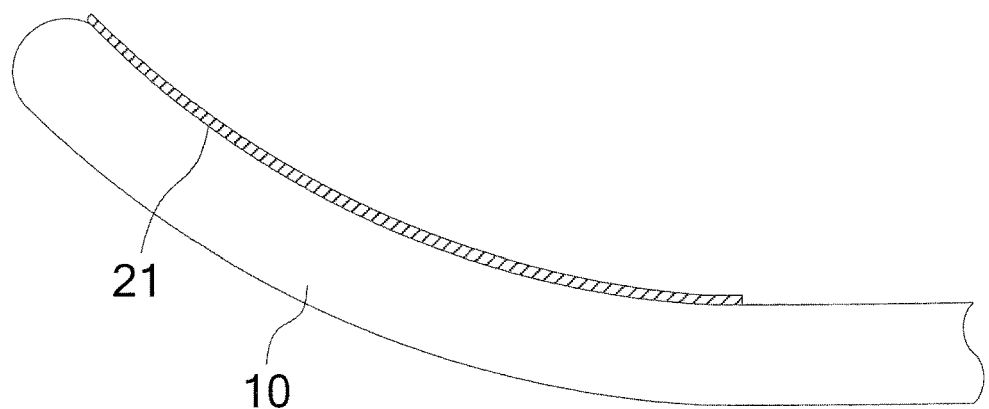
Figure 9G:
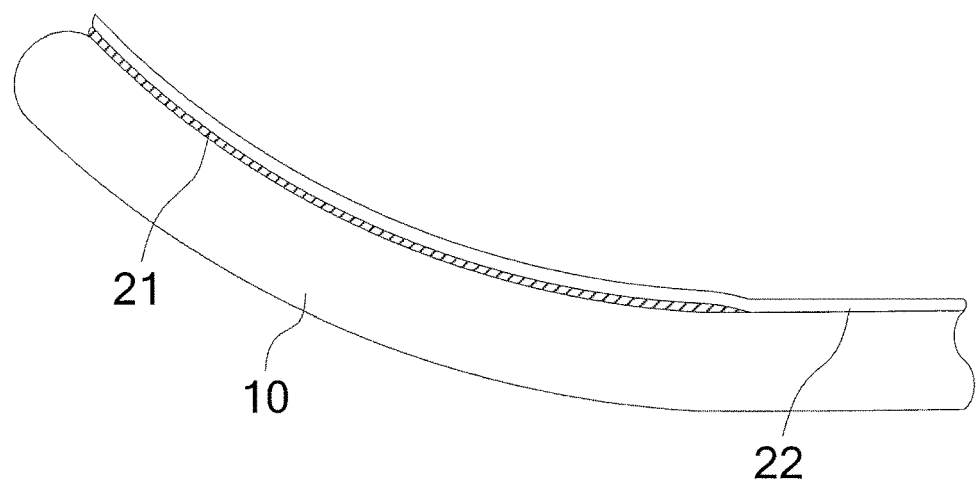

After processing the lithography process, the whole device is remaining the 3D substrate 10 and the color photo resist layer 21 fitted thereon, which is shown in FIG. 9F. Then, the second protective layer 22 is formed on it and curing after that, as the structure shown in FIG. 9G.

Figure 9H:
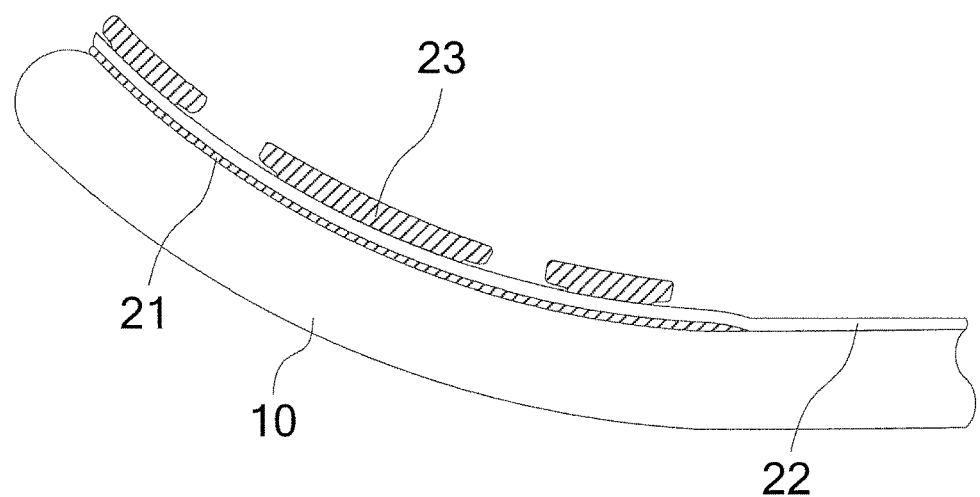
Figure 9I:
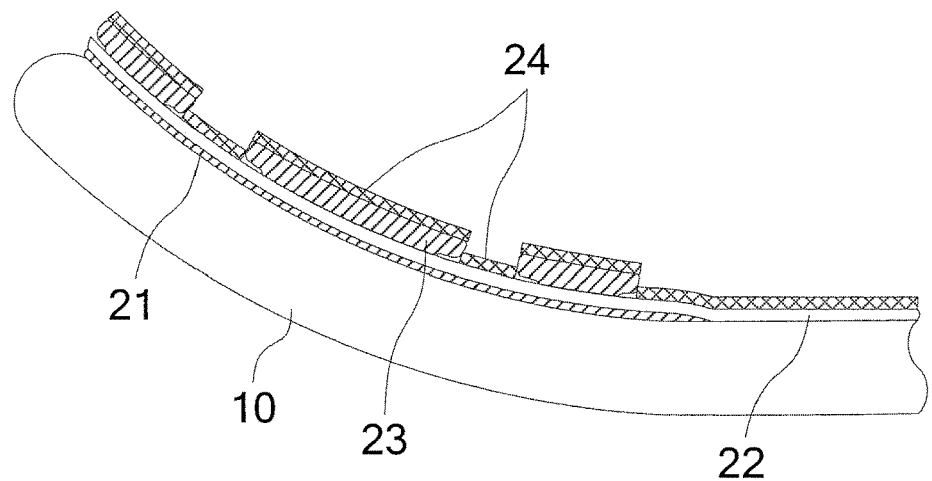
Figure 9J:
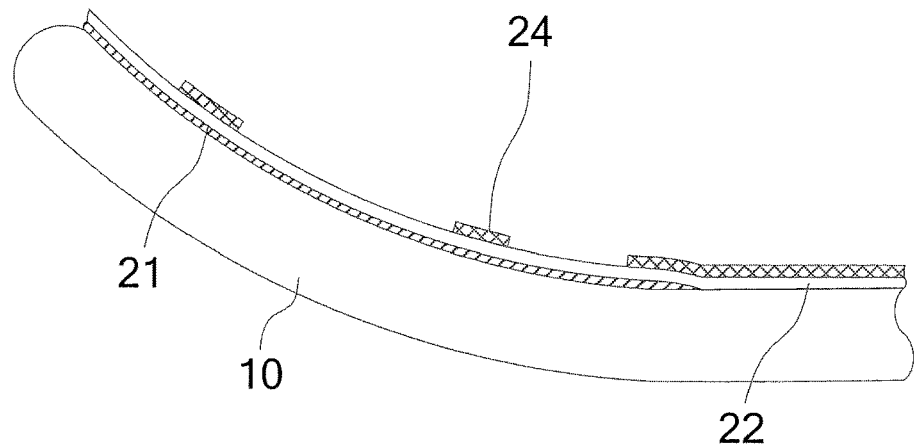
Figure 9K:
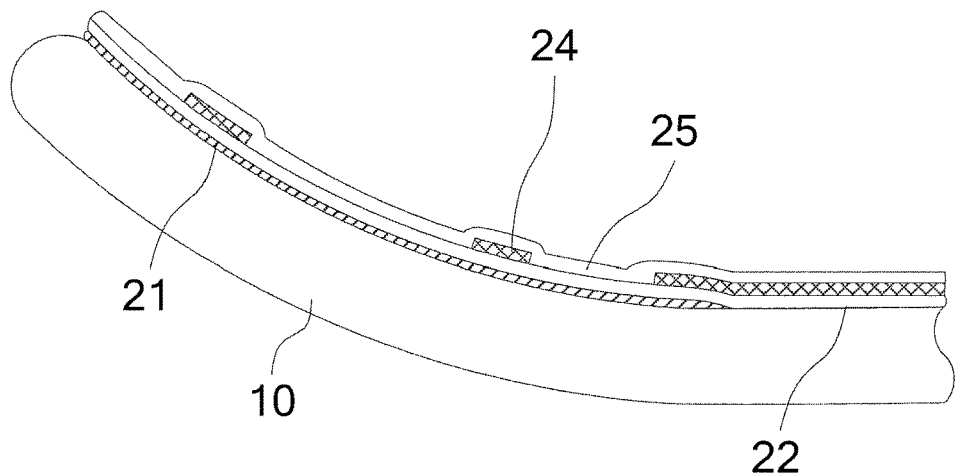

Then, forming the photo resist layer 23 which is necessary to forming a circuit pattern by the thin-film mask fitting process shown in FIG. 9A-9E, for example, forming a undermined concave corner on the edge by the negative photo-resist layer makes the negative photo-resist layer strip easier during a lift-off procedure, which is shown as FIG. 9H. After that, forming a thin-film layer on the 3D substrate 10 having photo resist layer 23 as shown in FIG. 9I. Because of the photo resist layer 23 is a negative photo-resist layer having the undermined concave corner on the edge, the thin-film layer formed on the photo resist layer 23 would be removed while the photo resist layer 23 is removed, therefore, a remaining part of said photo resist layer and the thin film layer which corresponding to said 3D pattern structure would form a circuit pattern 24, which shown in FIG. 9J. Last, forming a second protective layer 25 on the circuit pattern 24 to finish the construction of the multilayer 3D pattern, which shown in FIG. 9K.

Besides, the fitting aid of present invention could also be formed as the type which the outside of the fitting aid is solid silicone gel and the liquid solid gel is contained inside of the fitting aid. This type of the fitting aid provides the same feature that it would have a corresponding deformation during the press-fitting process. Further, the material of fitting aid also extends the reach of other non-silicone flexible materials, such as an elastic material with high transmittance.

The embodiments mentioned above fully illustrate all the aspect of the fitting aid composed of the flexible materials. Next, please refer to the figures and the following description, the characteristics of the fitting aid composed of hard materials is disclosed.

Figure 10A:
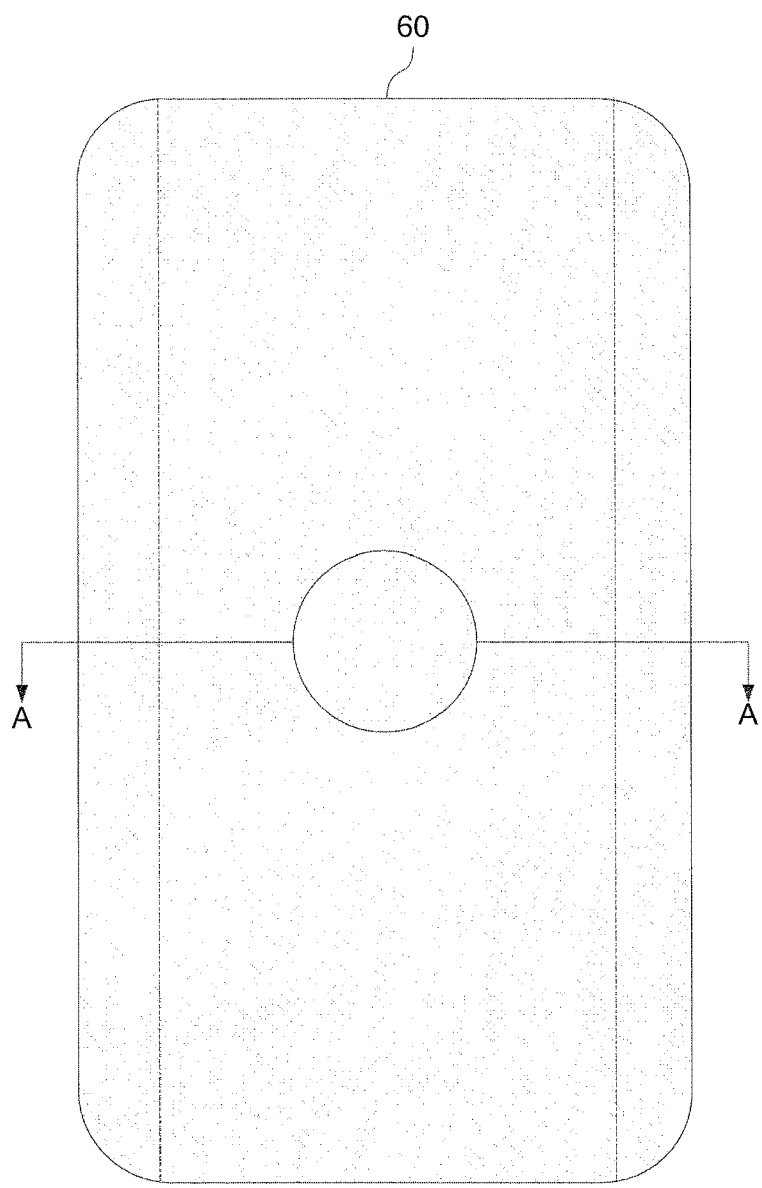
FIG. 10A shows a top view of the fitting aid according to another embodiment of the present disclosure.
Figure 10B:
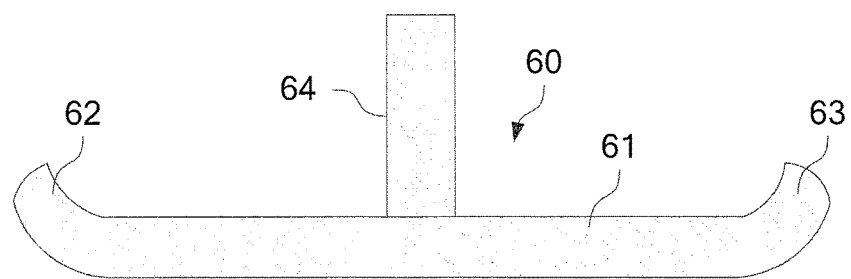
FIG. 10B shows a cross-sectional view along A-A cut of the FIG. 10A of the present disclosure.

Next, refer to FIG. 10A, FIG. 10B and FIG. 11A to 11H, the shape of fitting aid 60 composed of a hard material is prepared previously and fit on the 3D substrate 10, as FIG. 10B shows, fitting aid 60 comprising a bottom 61, a first three-dimensional site 62, a second three-dimensional site 63 and a supporting rib 64. The supporting rib 64 is used to help position the fitting aid 60 because of the less flexibility of hard material. Also, on the bottom of the fitting aid 60 where contact to the thin-film mask can set up a flexible thin-film to enhance the effect of fitting and pasting.

Figure 11A:
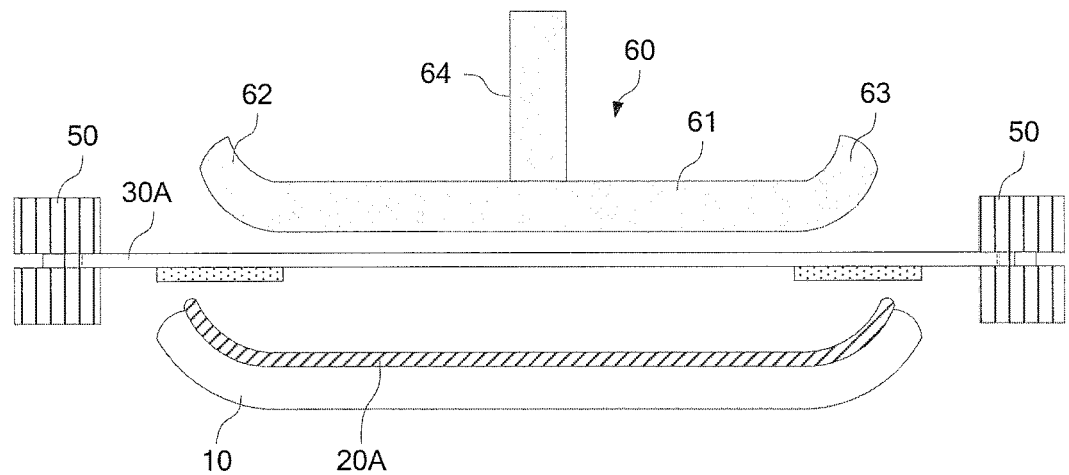
FIGS. 11A to 11K show a flow chart in cross-sectional view of fitting a thin-film mask to a curved substrate according to an embodiment of FIG. 1D of the present disclosure
Figure 11B:
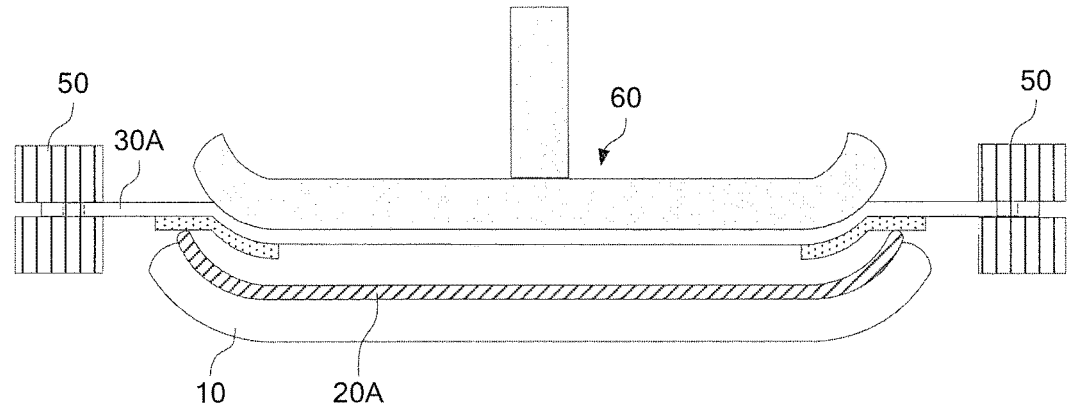
Figure 11C:
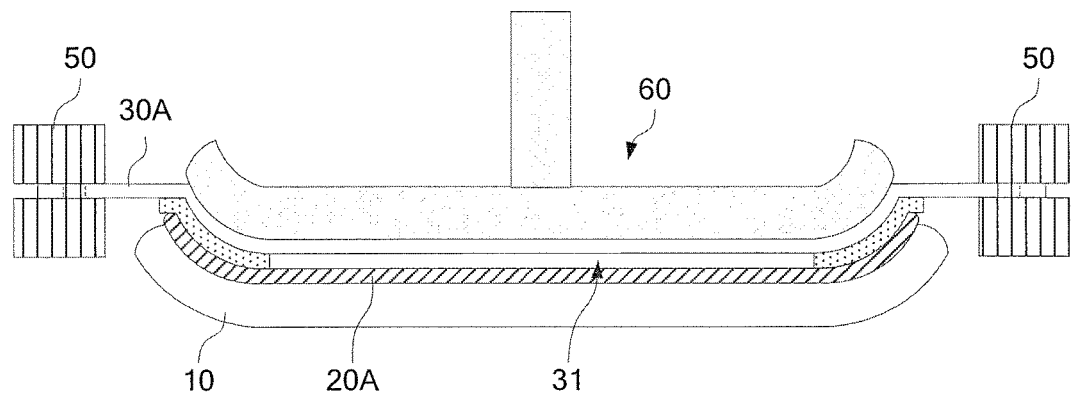

Refer to FIG. 11A to FIG. 11E, which show the fitting process when the fitting aid is composed of the hard materials. FIG. 11A shows that providing a curved substrate having a photo-resist layer, a thin-film mask and a fitting aid composed of hard material, and setting the thin-film mask between the 3D substrate and the fitting aid FIG. 11B to FIG. 11C show the step of press-fitting the thin-film mask to the curved substrate by using fitting aid.

Figure 11D:
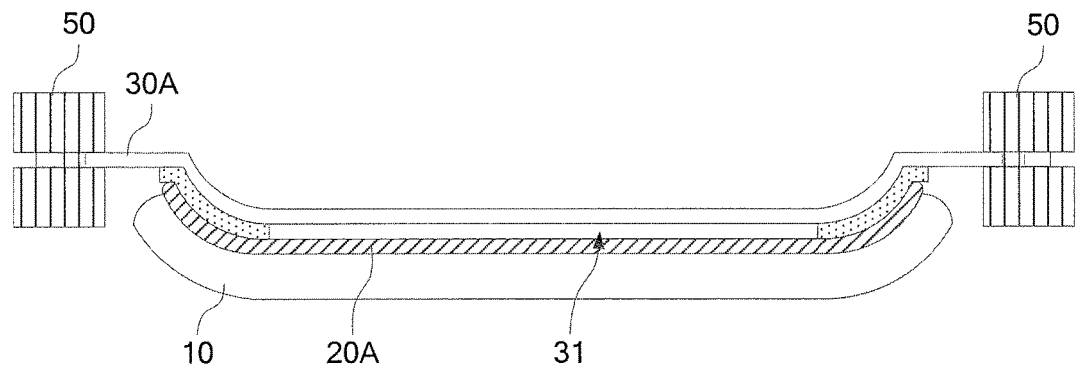
Figure 11E:
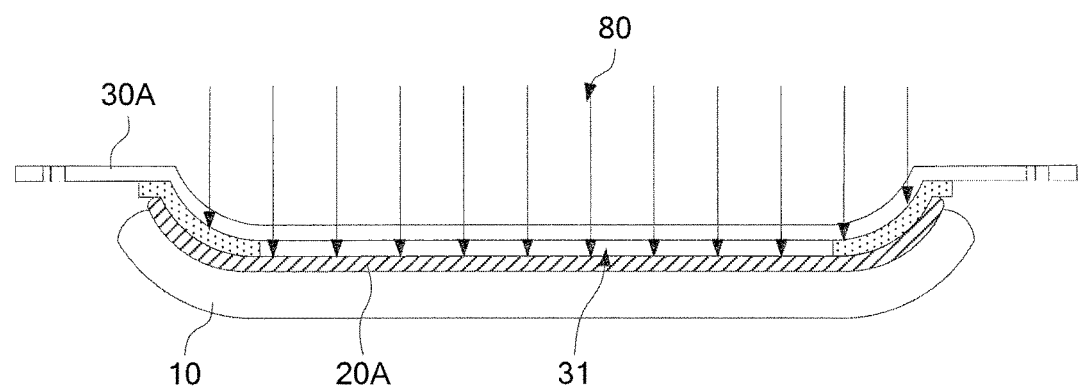

FIG. 11D shows the step of removing the fitting aid. For example, the thin-film matrix will deform and fit on the positive photo-resist layer 20A of the 3D substrate 10 if the vacuum pumping is executed.

Figure 11F:
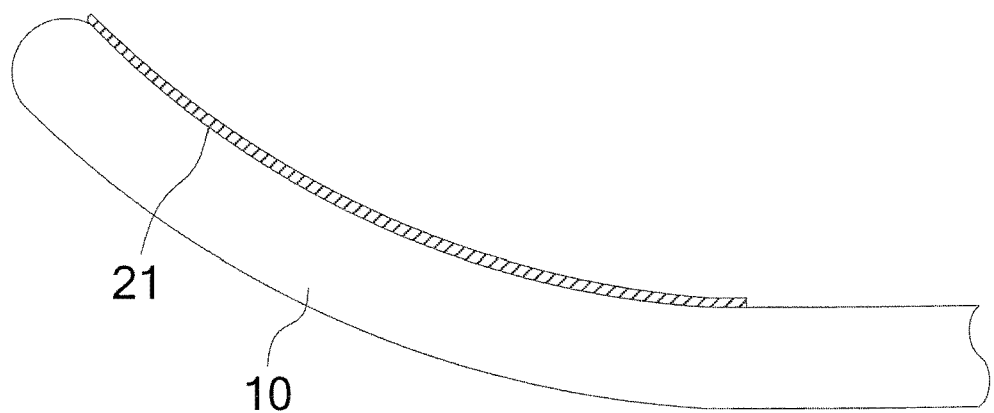
Figure 11G:
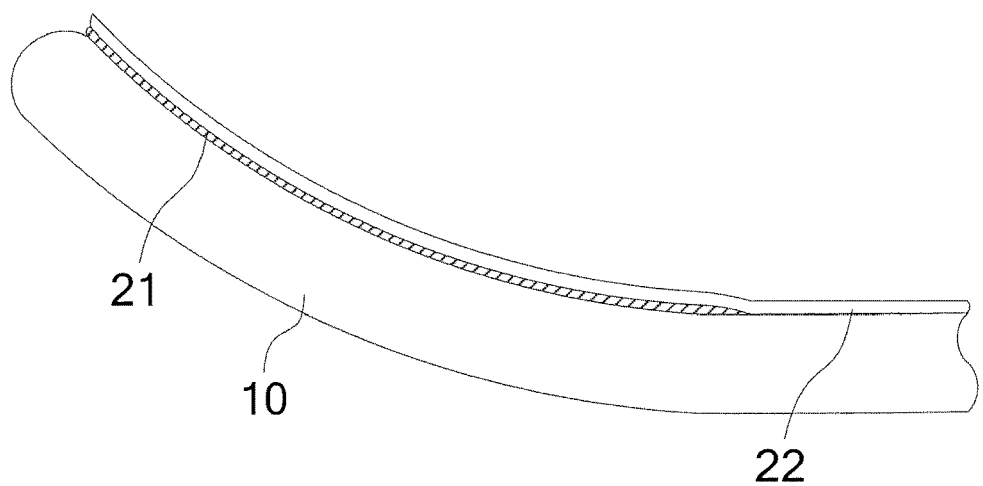

After processing the lithography process, the whole device is remaining the 3D substrate 10 and the color photo resist layer 21 fitted thereon, which is shown in FIG. 11F. Then, the second protective layer 22 is formed on it and curing after that, as the structure shown in FIG. 11G.

Figure 11H:
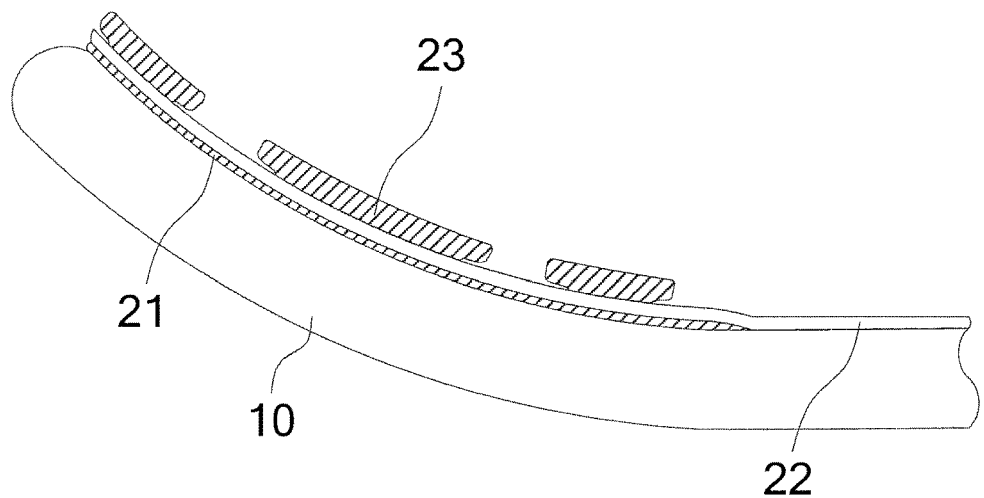
Figure 11I:
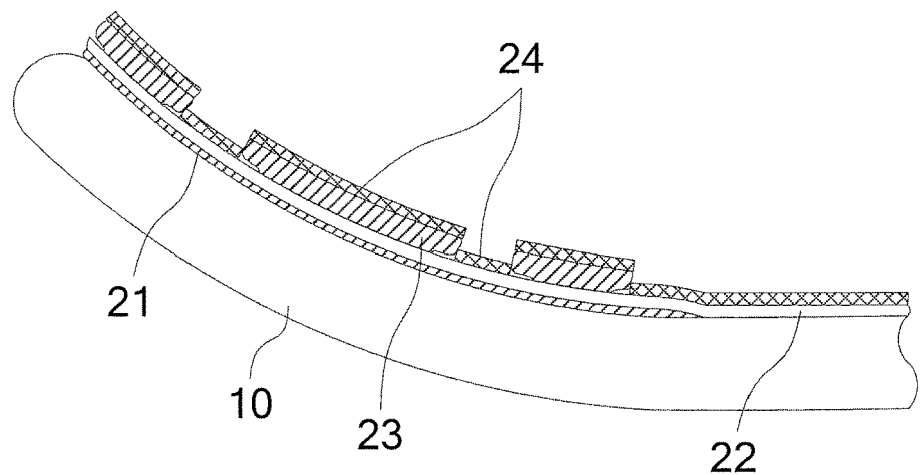
Figure 11J:
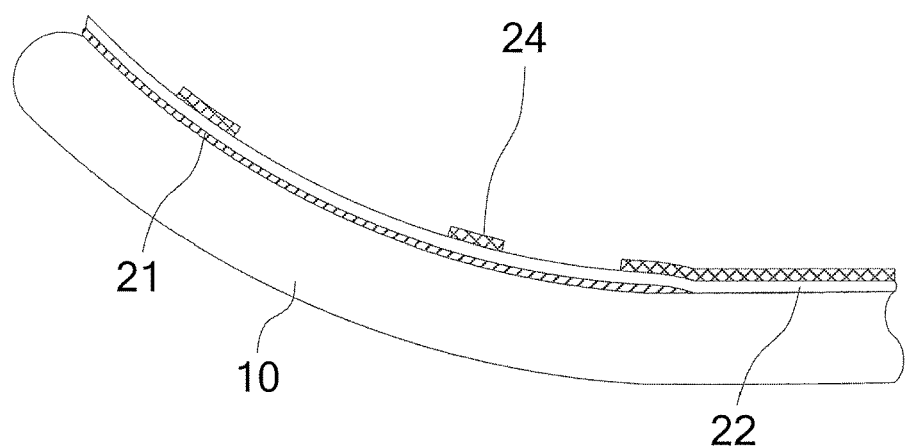
Figure 11K:
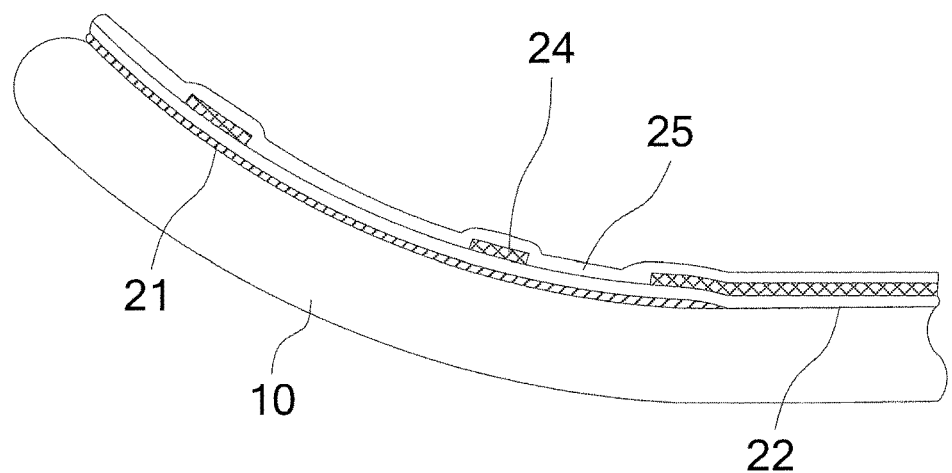

Then, forming the photo resist layer 23 which is necessary to forming a circuit pattern by the thin-film mask fitting process shown in FIG. 11A-11E, for example, forming a undermined concave corner on the edge by the negative photo-resist layer makes the negative photo-resist layer strip easier during a lift-off procedure, which is shown as FIG. 11H. After that, forming a thin-film layer on the 3D substrate 10 having photo resist layer 23 as shown in FIG. 11I. Because of the photo resist layer 23 is a negative photo-resist layer having the undermined concave corner on the edge, the thin-film layer formed on the photo resist layer 23 would be removed while the photo resist layer 23 is removed, therefore, a remaining part of said photo resist layer and the thin film layer which corresponding to said 3D pattern structure would form a circuit pattern 24, which shown in FIG. 11J. Last, forming a second protective layer 25 on the circuit pattern 24 to finish the construction of the multilayer 3D pattern, which shown in FIG. 11K.

All of the embodiments of FIGS. 7A-7K, FIGS. 8A-8K, FIGS. 9A-9K and FIGS. 11A-11K are the embodiments which forming the color photo resist layer 21 first and making the circuit pattern 24 after that, which illustrated in FIG. 2E. On the other hands, as shown in FIG. 2D, it shows an embodiment which making the circuit pattern 24 first and then forming the color photo resist layer 21 after that. The reason the formation sequence could be reverse is because of that no matter forming the color photo resist layer 21 on the 3D substrate 10 or making the circuit pattern 24 on the 3D substrate 10 are both processing the thin film mask fitting process which fitting the thin film mask on the 3D substrate precisely. Therefore, a high precision photo resist pattern could be obtained, and the color photo resist pattern or a thin film circuit pattern would be remained after the lithography process or the lift-off procedure.

Besides, the numbers of the color photo layers could be more than one. The colors of the color photo layers could be all the colors of the spectrum, for example, transparent color, white color, black color, red color, yellow color, blue color, green color or the other similar example and the mixed color thereof, it all depends on the requirement of design. When the color photo layers is a multilayer structure, it could have a slope structure as shown in FIG. 7G by forming the multiple color photo resist layer and curing them after that. Additionally, the thickness of the color photo layers is between 0.5 micrometers and 30 micrometers, and the trace width is more than 10 millimeters. Also, when the color photo resist layer is more than two layers, the uppermost layer is transparent color. Additionally, the hardness of the hardened color photo resist layer is between 2 H to 4 H.

Further, the 3D substrate 10 is made of a glass material, a plastic material, or a ceramic material.

To sum up, by the methods and the apparatus of present invention, the tools could easily to match each other, and the curved surface patterns on the curved substrate can be mass production by the light resist technique, and increase the quality, the product precision, and the yield of products.

Accordingly, the present disclosure conforms to the legal requirements owing to its novelty, non-obviousness, and utility. However, the foregoing description is only embodiments of the present disclosure, not used to limit the scope and range of the present disclosure. Those equivalent changes or modifications made according to the shape, structure, feature, or spirit described in the claims of the present disclosure are included in the appended claims of the present disclosure.

The invention claimed is:

1. A method for forming a 3D pattern structure on a 3D substrate, comprising:
   providing a 3D substrate, a thin-film mask, a fitting aid, said thin-film mask having a visible pattern corresponding to said 3D pattern structure;
   forming a photo resist layer on said 3D substrate;
   applying a thin-film mask attaching process by said fitting aid, which attaching said thin-film mask on said 3D substrate with said photo resist layer; and
   carrying out a photo resist stripping process to form said 3D pattern structure on said 3D substrate;
   forming a color photo resist layer on said 3D substrate having said 3D pattern structure;
   applying a thin-film mask attaching process by said fitting aid, which attaching a second thin-film mask on said 3D substrate with said color photo resist layer; and
   carrying out a lithography process to form a color photo resist pattern structure on said 3D substrate having said 3D pattern structure.

2. The method as claimed in claim 1, said fitting aid composed of an elastic material with high transmittance, passed through by the light having a wavelength between 300 nanometers and 500 nanometers, selected from silicone, silicone oil coated soft outer layer, silicon organic material and fluorine-containing organic material.

3. The method as claimed in claim 1, wherein said photo resist stripping process comprising steps:
   exposing said 3D substrate with said photo resist layer to remove needless part of said photo resist layer and to keep a remaining part of said photo resist layer corresponding to said 3D pattern structure;
   forming a thin-film layer on said 3D substrate having said 3D pattern structure; and
   removing said remaining part of said photo resist layer and keeping said thin-film layer which not forming on said remaining part of said photo resist to form said 3D pattern structure.

4. The method as claimed in claim 1, wherein said thin-film mask attaching process comprising steps:
   allocating said thin-film mask between said 3D substrate and said fitting aid; and
   applying said fitting aid to press and paste said thin-film mask to said 3D substrate.

5. The method as claimed in claim 4, further comprising a step of vacuum pumping to remove the air between the thin-film mask and the 3D substrate after the step of press-fitting step.

6. The method as claimed in claim 5, said fitting aid composed of an elastic material with high transmittance, passed through by the light having a wavelength between 300 nanometers and 500 nanometers, selected from silicone, silicone oil coated soft outer layer, silicon organic material and fluorine-containing organic material.

7. The method as claimed in claim 1, said 3D pattern structure is a stereo circuit.

8. The method as claimed in claim 1, said color photo resist layer having at least one color photo resist.

9. The method as claimed in claim 1, said color photo resist layer having multiple color photo resists, and said 3D substrate is curing after forming said color photo resists.

10. A method for forming a 3D pattern structure on a 3D substrate, comprising:
    providing a 3D substrate, a thin-film mask, a fitting aid, said thin-film mask having a visible pattern corresponding to said 3D pattern structure;
    forming a photo resist layer on said 3D substrate;
    applying a thin-film mask attaching process by said fitting aid, which attaching said thin-film mask on said 3D substrate with said photo resist layer; and
    carrying out a photo resist stripping process to form said 3D pattern structure on said 3D substrate;
    wherein before the step carrying out a photo resist stripping process, further comprising steps:
        forming a color photo resist layer on said 3D substrate;
        applying a thin-film mask attaching process by said fitting aid, which attaching a second thin-film mask on said 3D substrate with said color photo resist layer; and
        carrying out a lithography process to form a color photo resist pattern structure on said 3D substrate.

11. The method as claimed in claim 10, said color photo resist layer having at least one color photo resist.

12. The method as claimed in claim 10, said color photo resist layer having multiple color photo resists, and said 3D substrate is curing after forming said color photo resists.

* * * * *